(12) United States Patent
Takizawa

(10) Patent No.: US 10,964,368 B2
(45) Date of Patent: Mar. 30, 2021

(54) SEMICONDUCTOR MEMORY DEVICE

(71) Applicant: TOSHIBA MEMORY CORPORATION, Tokyo (JP)

(72) Inventor: Ryousuke Takizawa, Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 16/567,901

(22) Filed: Sep. 11, 2019

(65) Prior Publication Data
US 2020/0312395 A1    Oct. 1, 2020

(30) Foreign Application Priority Data

Mar. 27, 2019  (JP) .............................. JP2019-060051

(51) Int. Cl.
*G11C 11/16* (2006.01)
(52) U.S. Cl.
CPC ........ *G11C 11/1673* (2013.01); *G11C 11/161* (2013.01); *G11C 11/1659* (2013.01); *G11C 11/1675* (2013.01); *G11C 11/1693* (2013.01)
(58) Field of Classification Search
CPC .............. G11C 11/1673; G11C 11/161; G11C 11/1659; G11C 11/1675; G11C 11/1693
See application file for complete search history.

(56) References Cited

U.S. PATENT DOCUMENTS

| 6,914,801 | B2 | 7/2005 | Kostylev et al. |
| 9,183,911 | B2 | 11/2015 | Alam et al. |
| 9,715,419 | B2 | 7/2017 | Kinney et al. |
| 2006/0092734 | A1 | 5/2006 | Tsuchida et al. |
| 2013/0188420 | A1 | 7/2013 | Chen et al. |
| 2018/0277186 | A1* | 9/2018 | Hatsuda .............. G11C 11/1693 |
| 2018/0277188 | A1* | 9/2018 | Fujino ................. G11C 11/1673 |
| 2019/0080740 | A1 | 3/2019 | Takahashi et al. |
| 2020/0302989 | A1* | 9/2020 | Osada ................. G11C 11/1697 |

FOREIGN PATENT DOCUMENTS

| CN | 109493897 A | 3/2019 |
| JP | 2006127672 A | 5/2006 |

OTHER PUBLICATIONS

Li, et al., "Thermally assisted magnetization reversal in the presence of a spin-transfer torque", Physical Review B, 2004, vol. 69, 134416.

* cited by examiner

*Primary Examiner* — Mushfique Siddique
(74) *Attorney, Agent, or Firm* — Holtz, Holtz & Volek PC

(57) ABSTRACT

According to one embodiment, a semiconductor memory device, includes a memory cell comprising a switching element and a resistance change element; and a first circuit that applies a first voltage to the memory cell, places the memory cell into an ON state by applying a second voltage to the memory cell while applying the first voltage to the memory cell in parallel, generates a third voltage based on a resistance state of the resistance change element by performing first voltage application to perform a first readout on the memory cell in the ON state, writes first data into the memory cell.

20 Claims, 33 Drawing Sheets

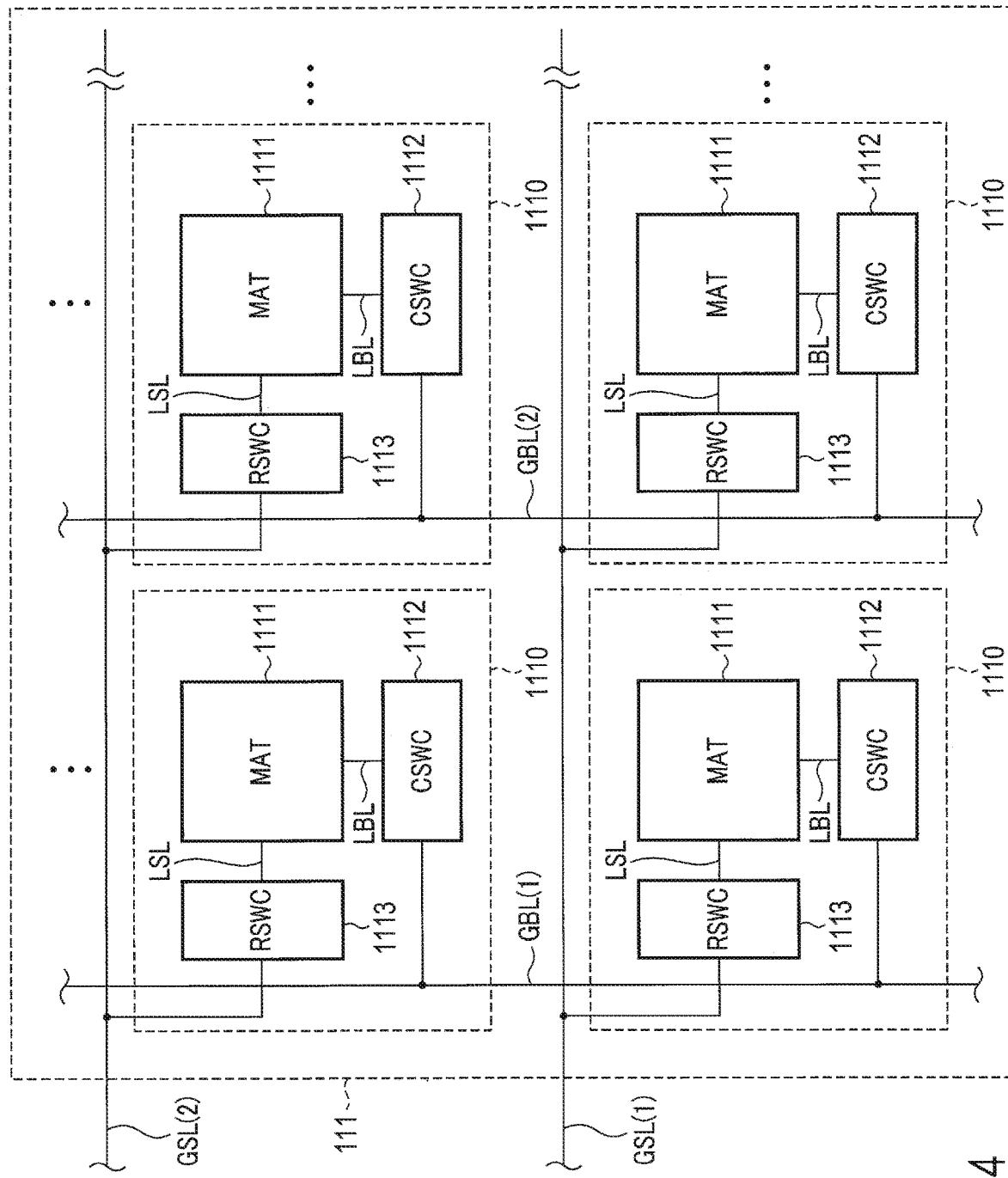
F I G. 4

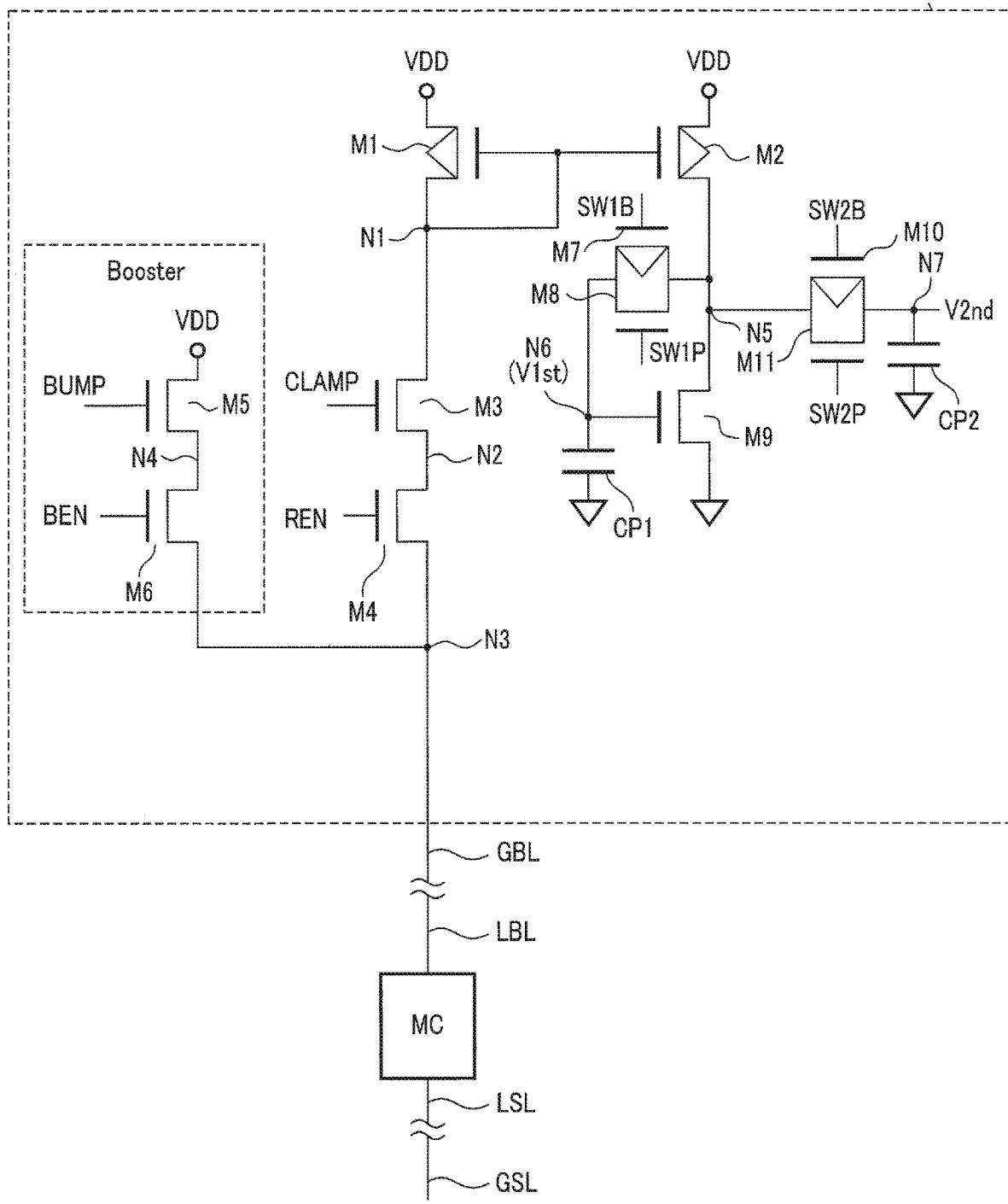
F I G. 6

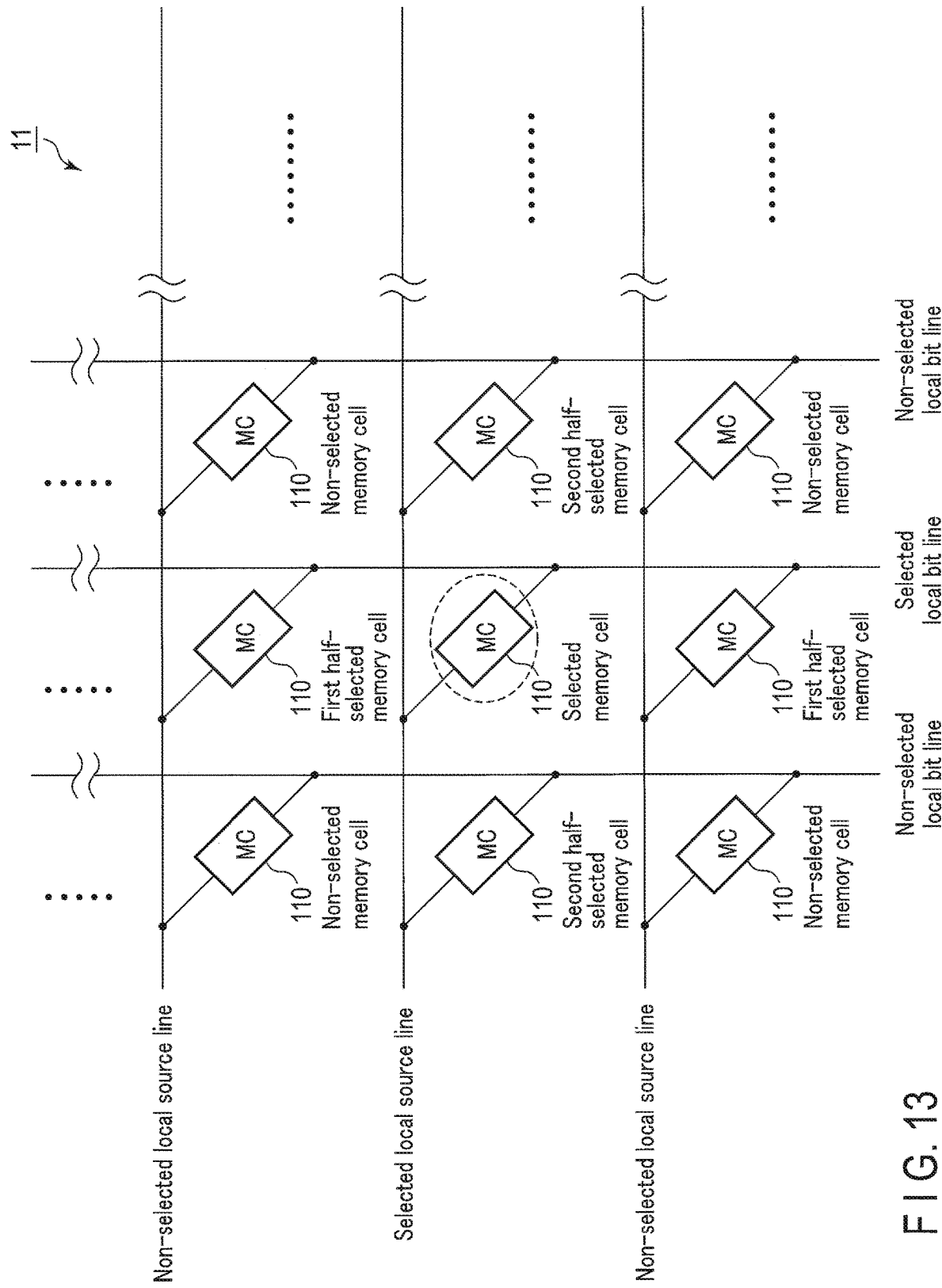
F I G. 13

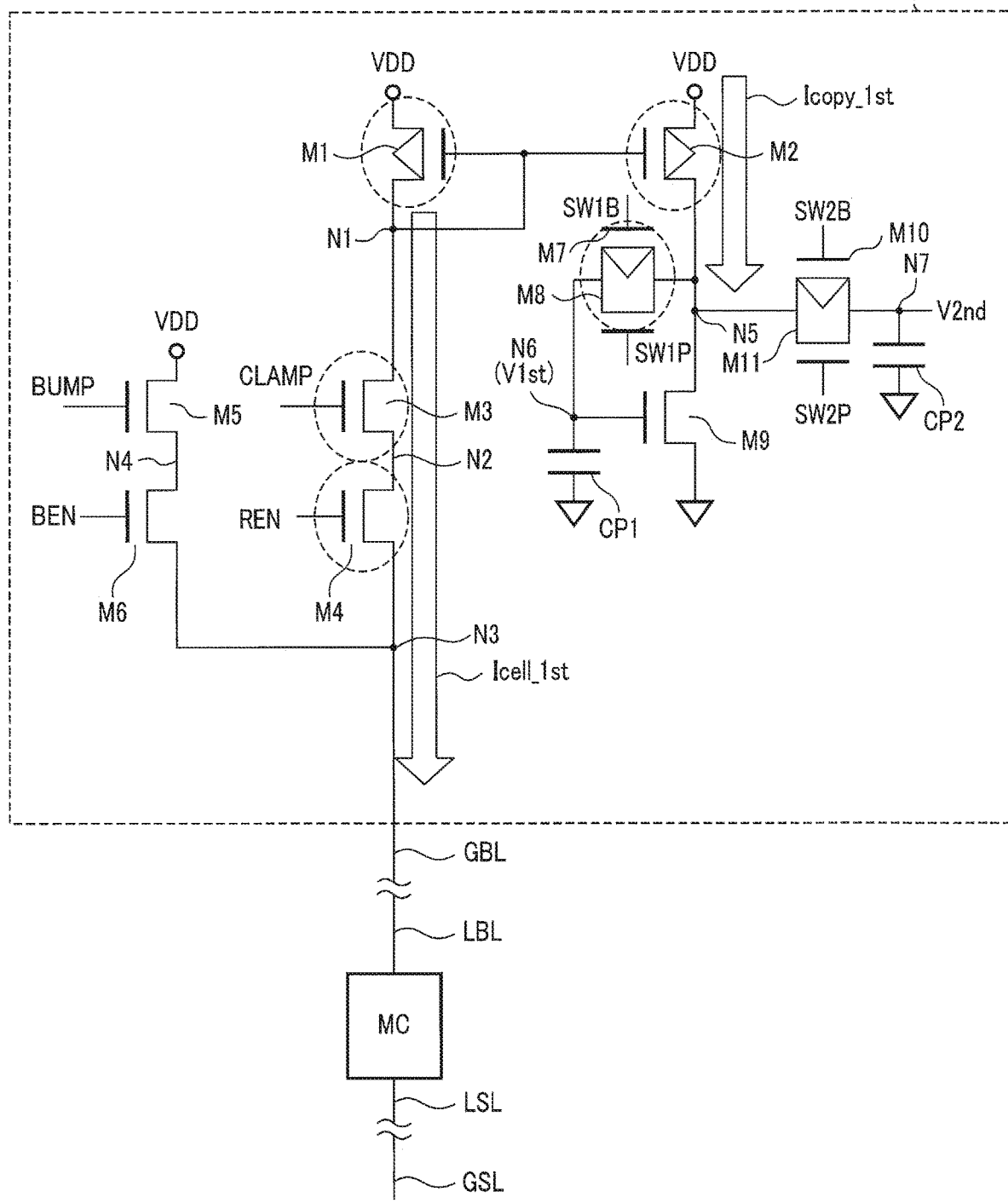
F I G. 19

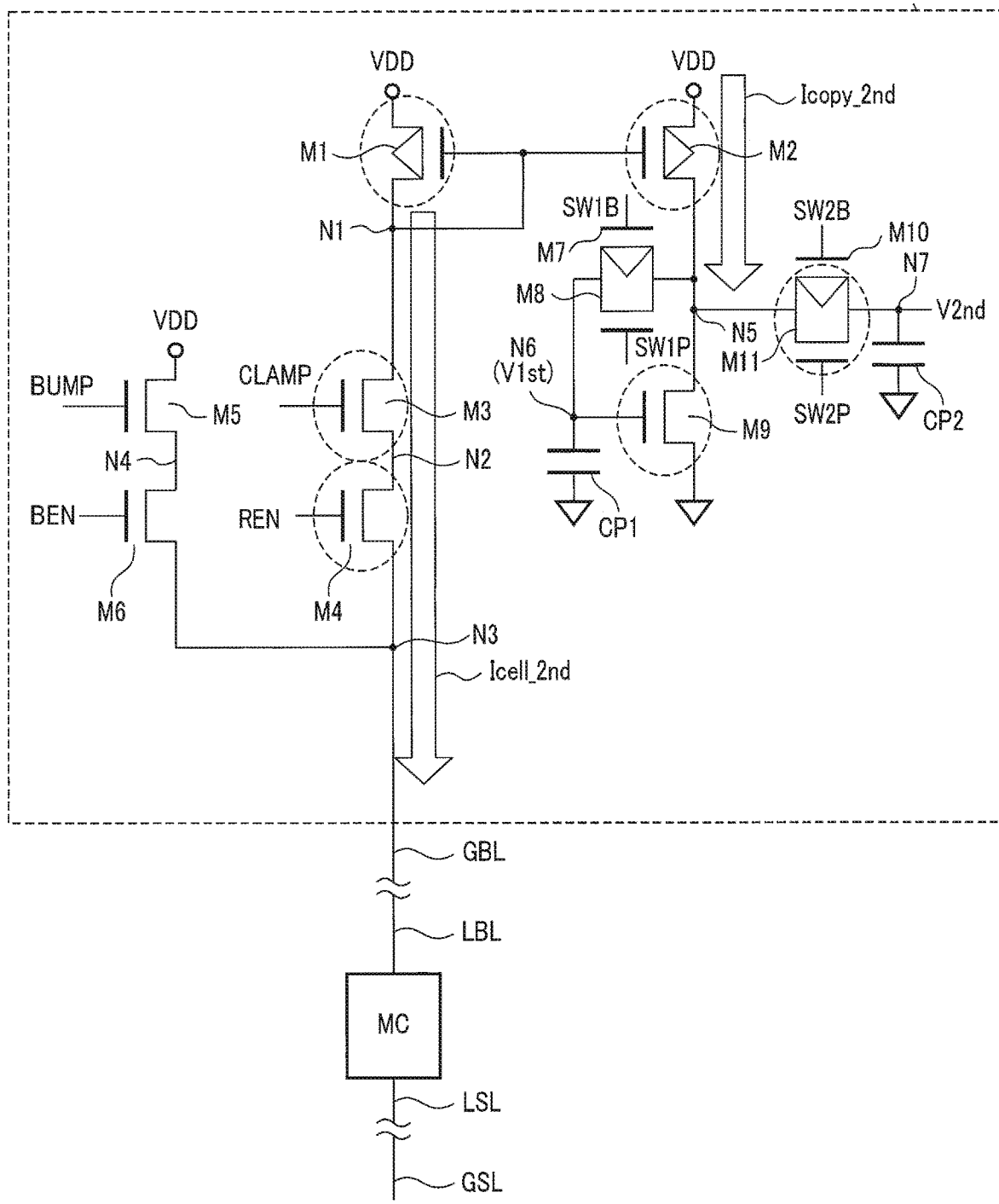
F I G. 20

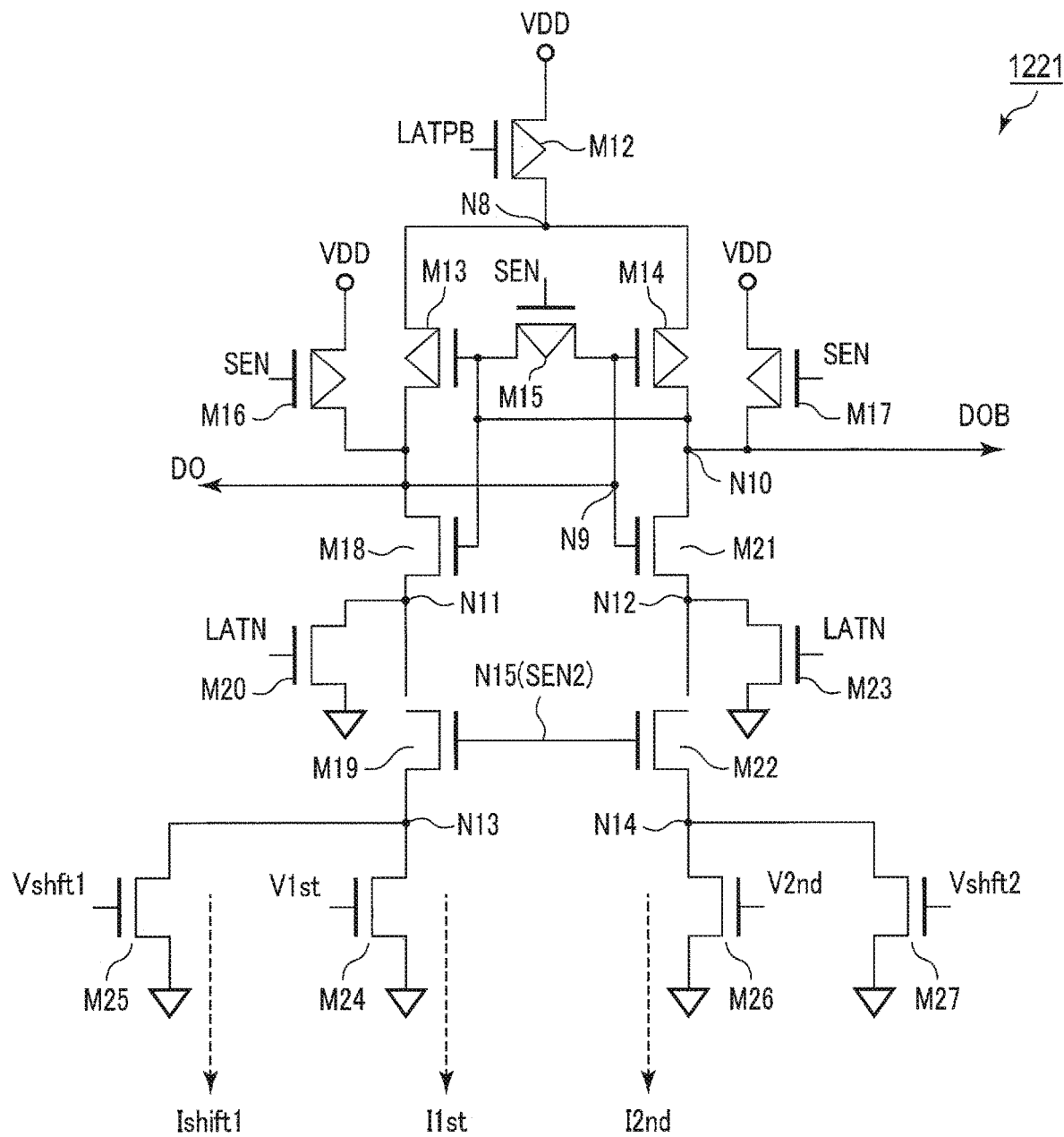
F I G. 21

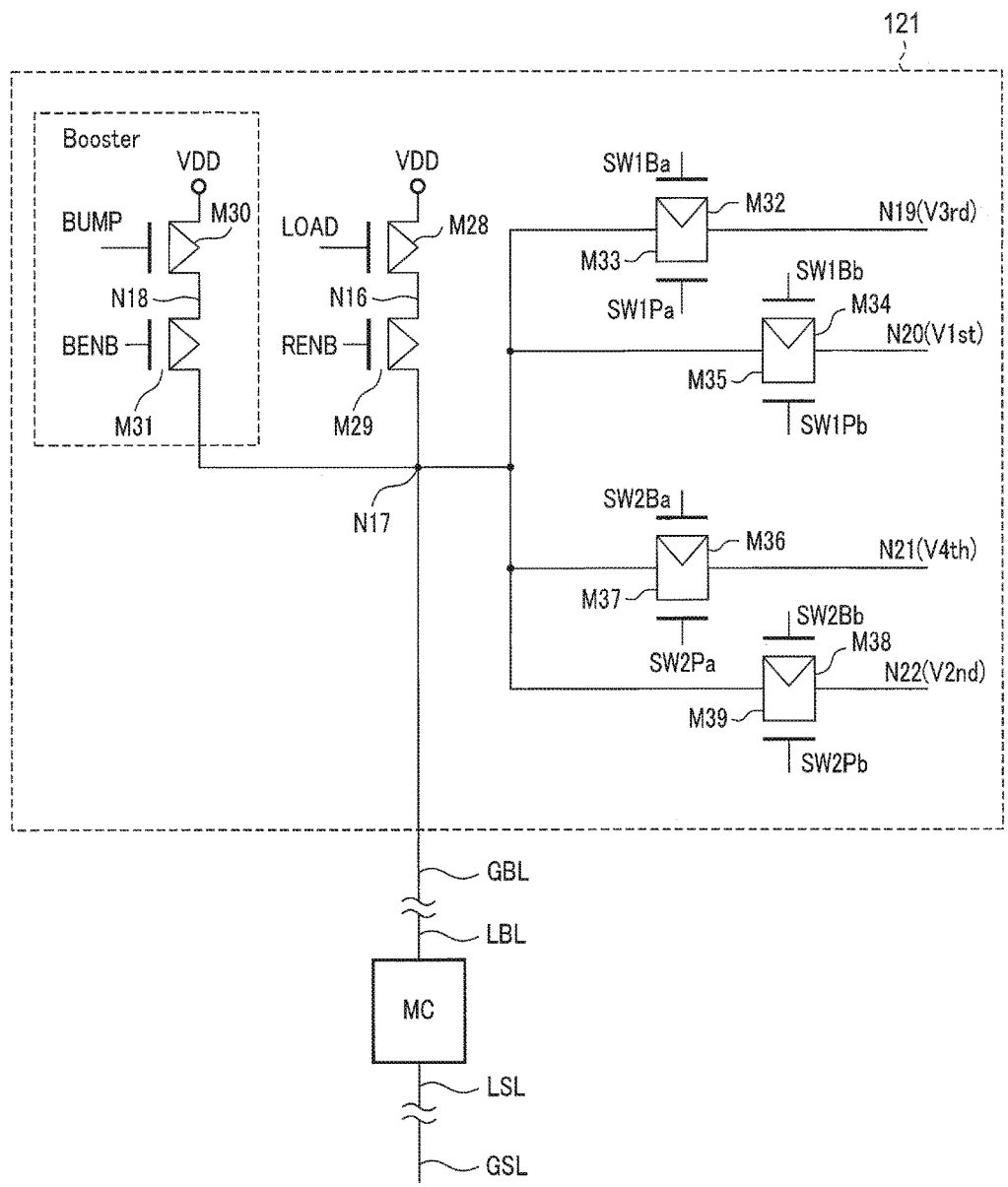
F I G. 28

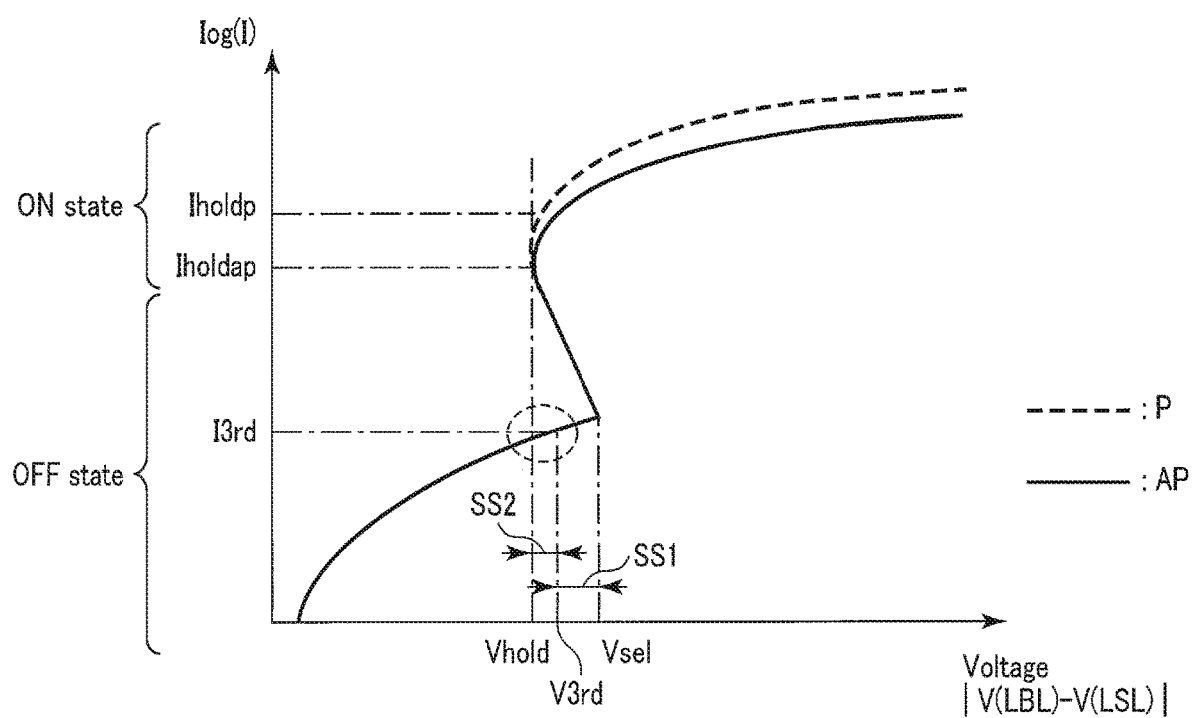
F I G. 30

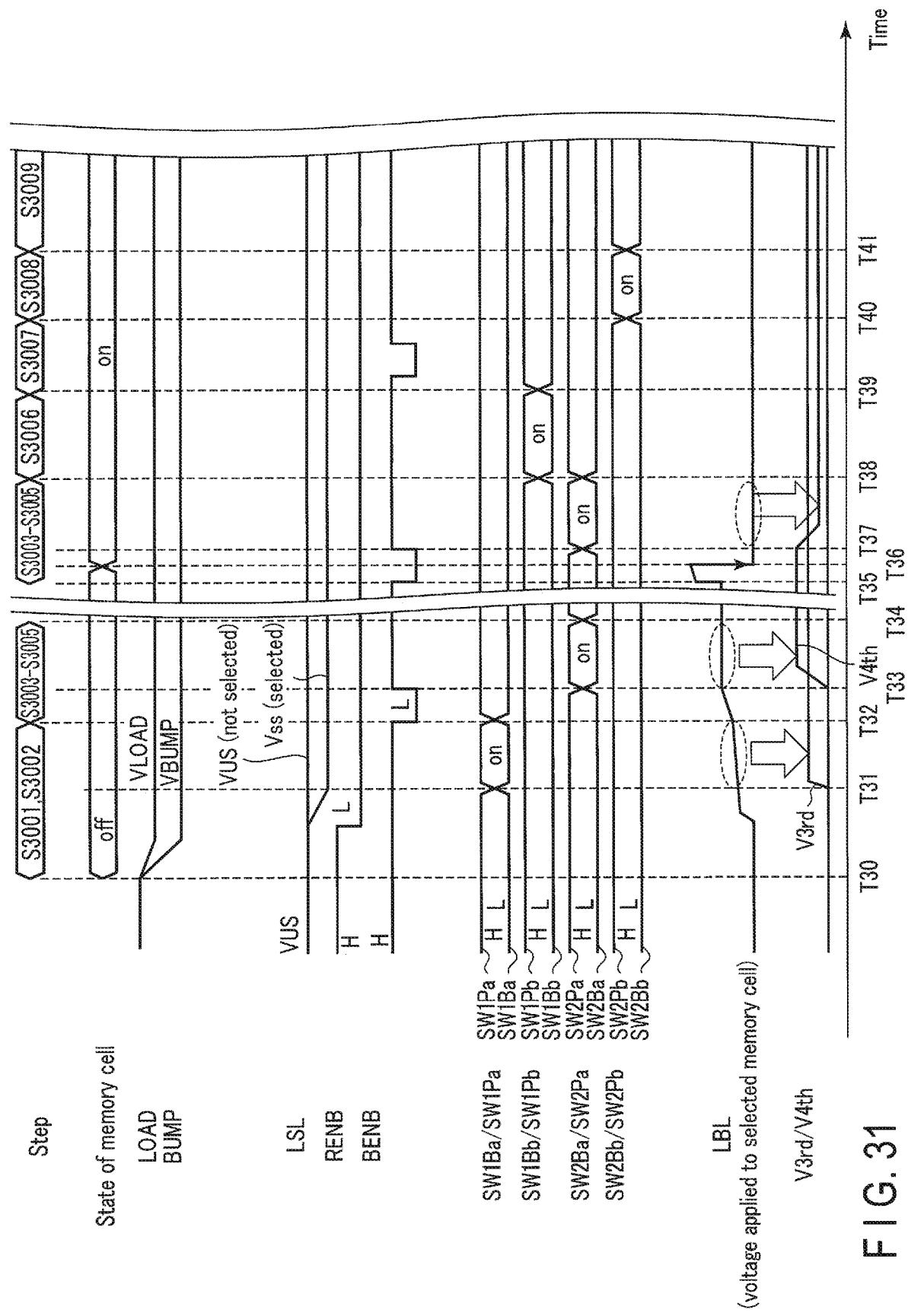
F I G. 31

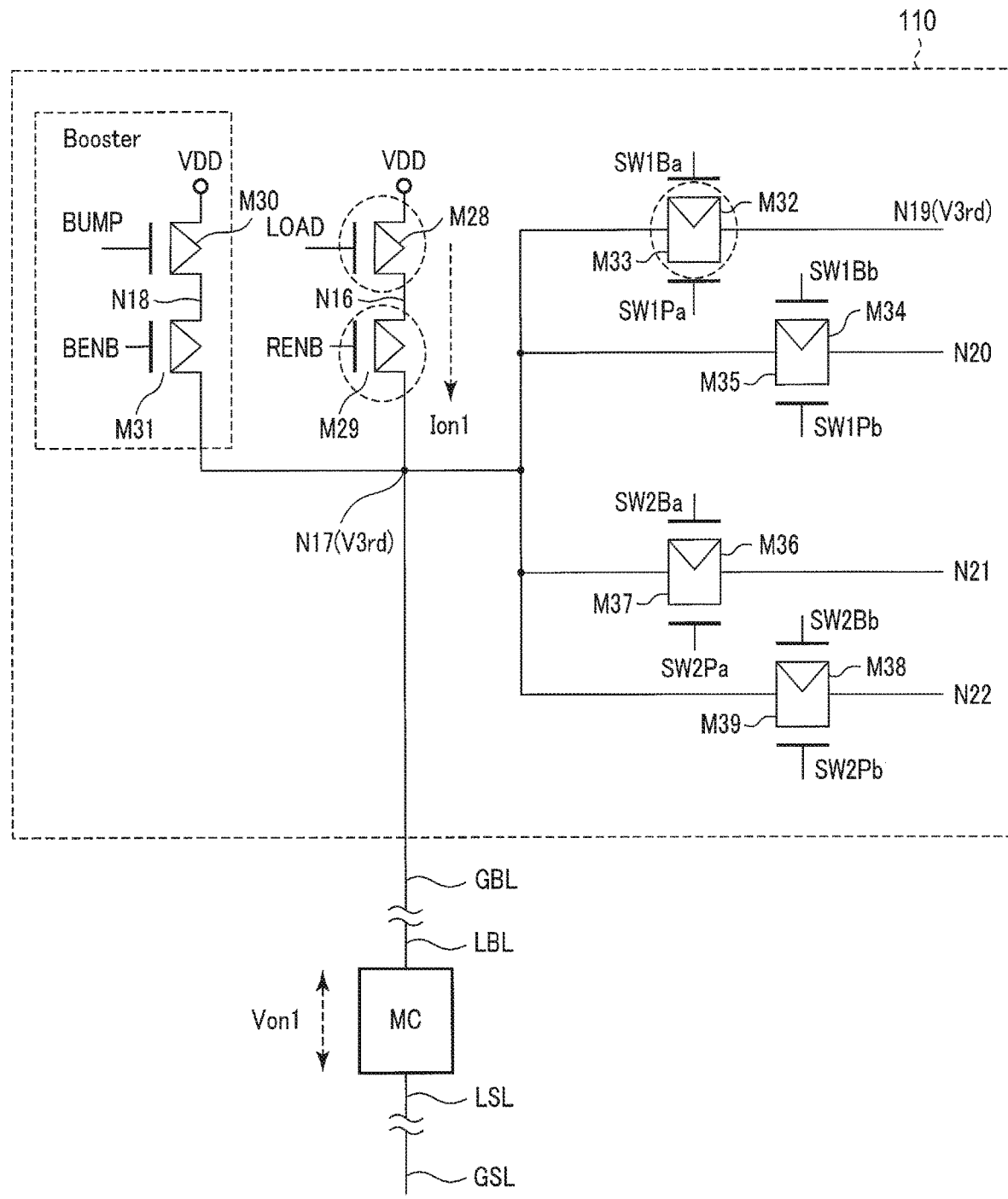
F I G. 32

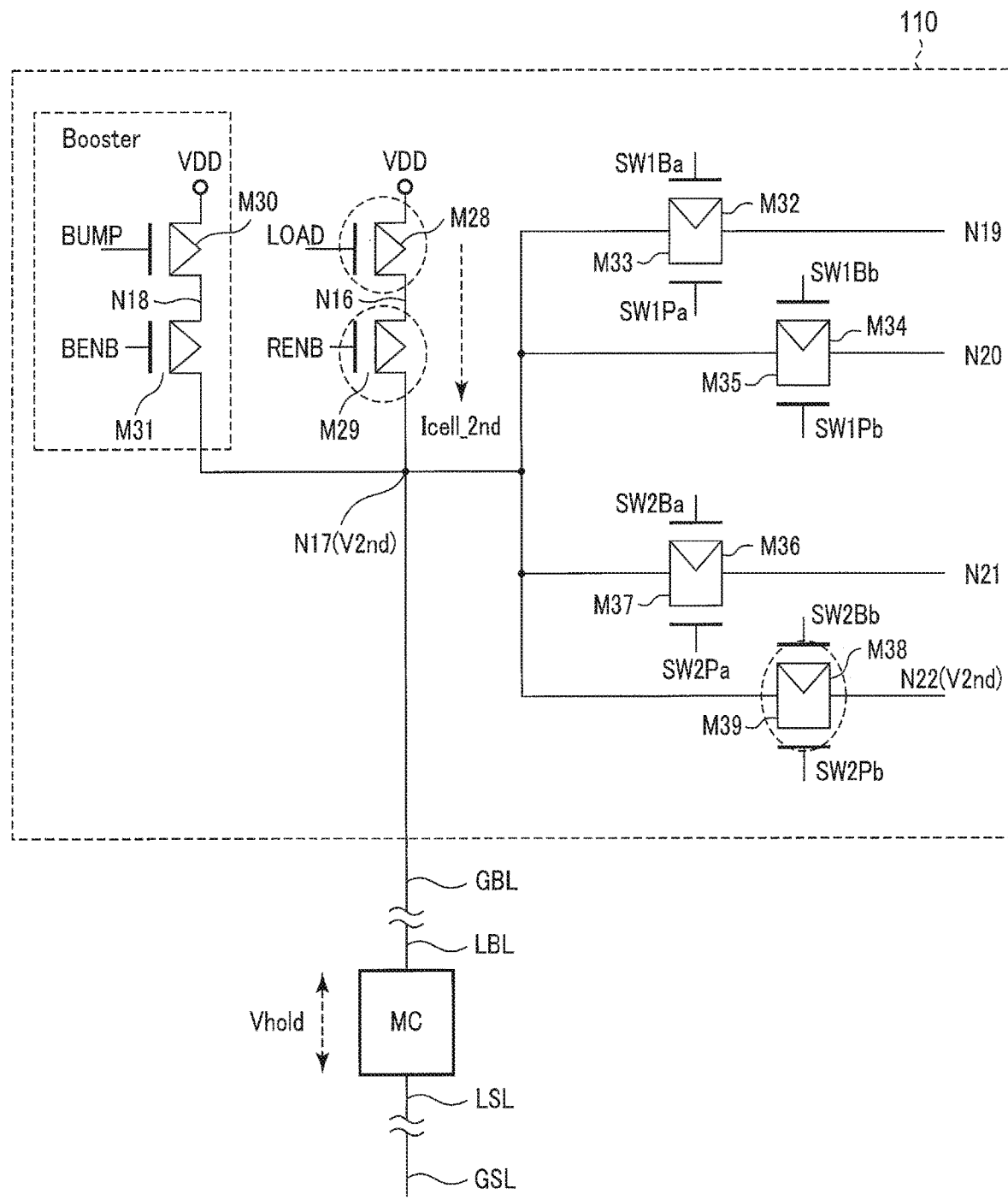
F I G. 35

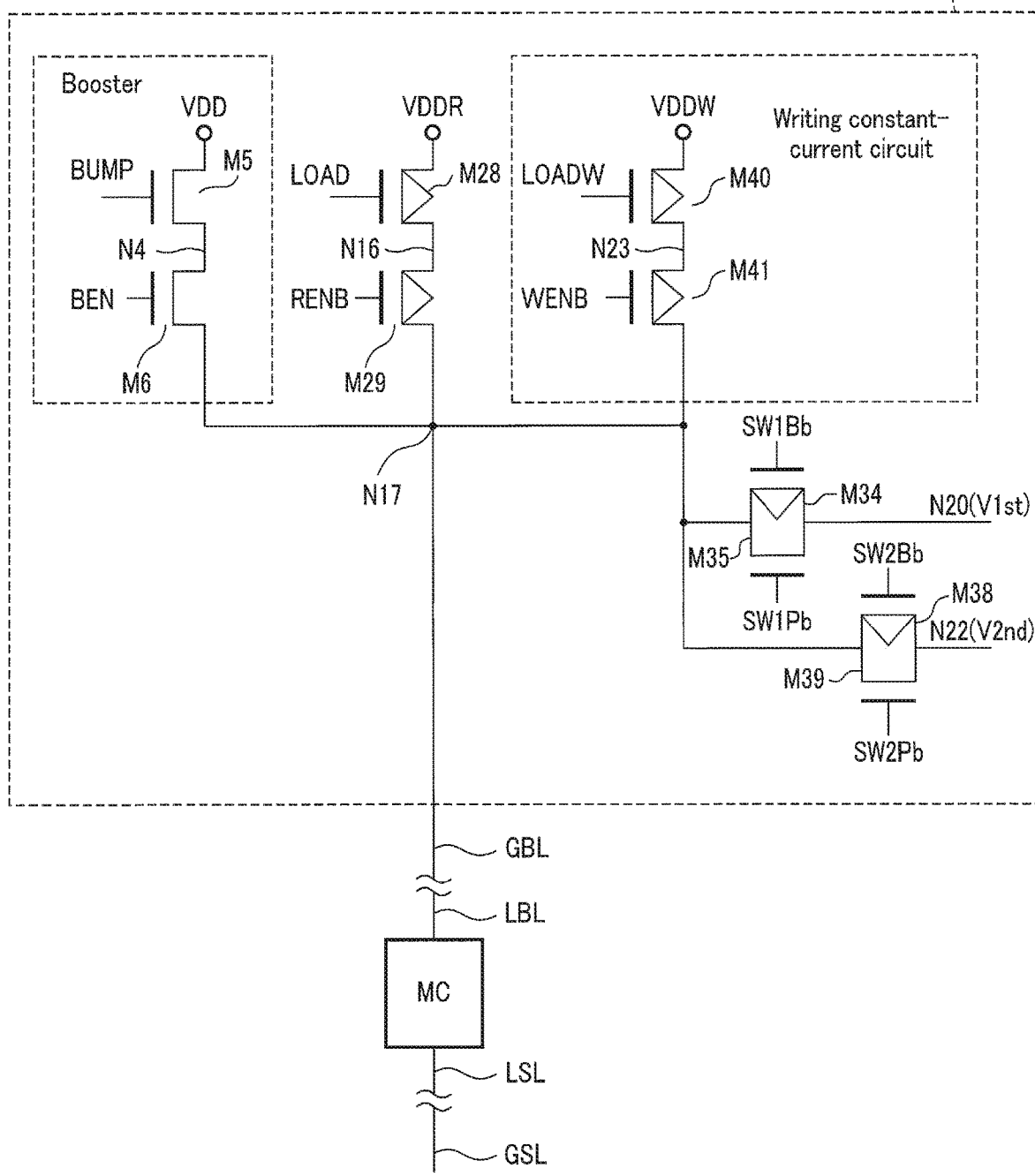
F I G. 36

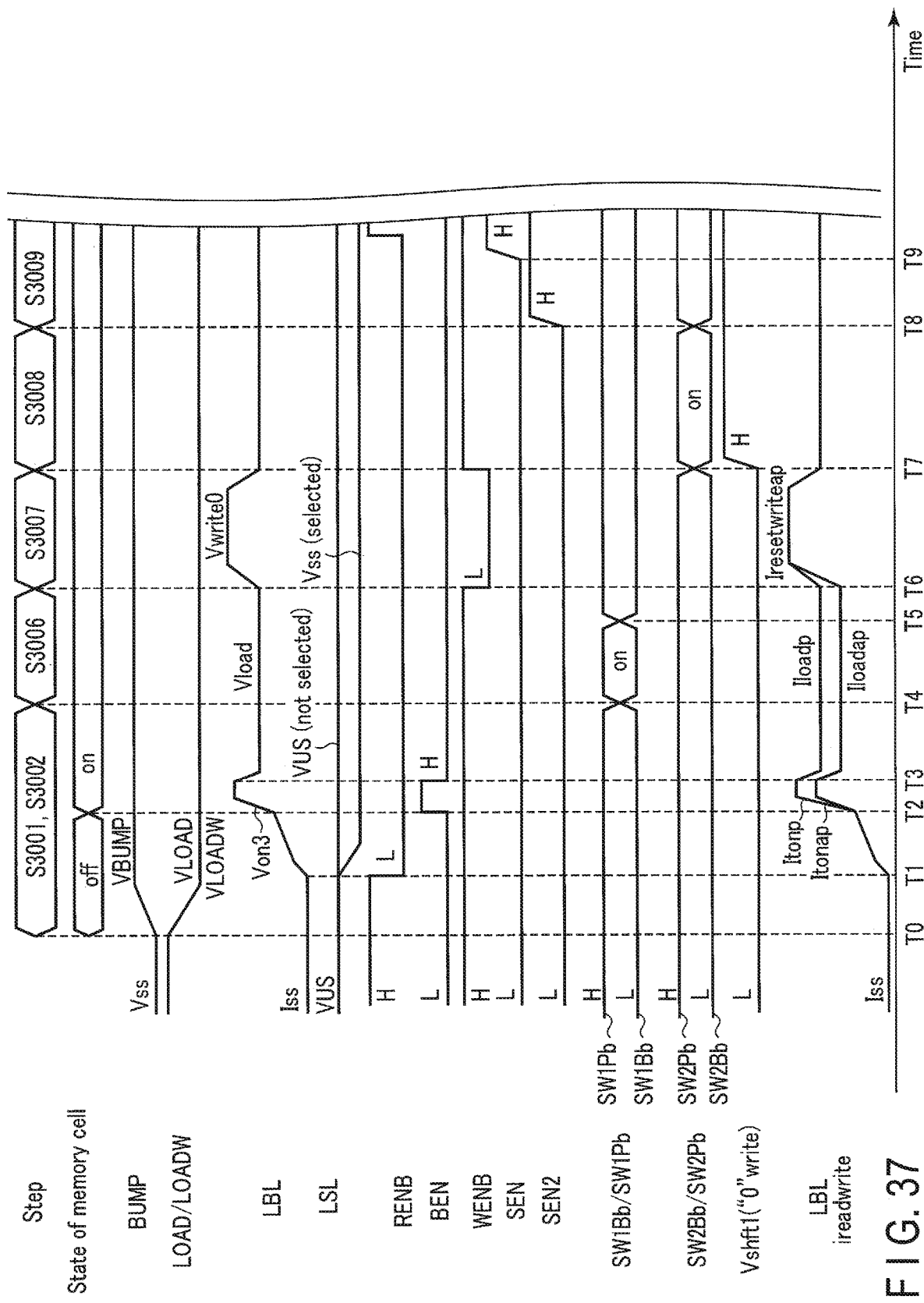
F I G. 37

SEMICONDUCTOR MEMORY DEVICE

CROSS-REFERENCE TO RELATED APPLICATIONS

This application is based upon and claims the benefit of priority from prior Japanese Patent Application No. 2019-060051, filed Mar. 27, 2019; the entire contents of which are incorporated herein by reference.

FIELD

Embodiments relate to a semiconductor memory device.

BACKGROUND

An MRAM (Magnetic Random Access Memory) is a memory device using a magnetic element having a magnetoresistive effect for a memory cell that stores information therein, and is gathering attention as a next-generation memory device characterized by high-speed operation, large capacity, and non-volatility. Research and development of the MRAM is conducted as a replacement for volatile memories such as DRAMs and SRAMs. In this case, the MRAM is desired to be operated with the same specifications as those of the DRAM and the SRAM in terms of suppressing development cost and facilitating the replacement.

BRIEF DESCRIPTION OF THE DRAWINGS

FIG. 4 is a block diagram illustrating a basic configuration of a memory cell array of the semiconductor memory device according to the first embodiment;

FIG. 6 is a circuit diagram illustrating a basic configuration of a preamplifier of the semiconductor memory device according to the first embodiment;

FIG. 13 is a circuit diagram illustrating a selected memory cell, half-selected memory cells, and non-selected memory cells of the semiconductor memory device according to the first embodiment;

FIG. 19 is a circuit diagram illustrating the preamplifier in the readout operation of the semiconductor memory device according to the first embodiment;

FIG. 20 is a circuit diagram illustrating the preamplifier in the readout operation of the semiconductor memory device according to the first embodiment;

FIG. 21 is a circuit diagram illustrating the amplifier in the readout operation of the semiconductor memory device according to the first embodiment;

FIG. 28 is a circuit diagram illustrating a basic configuration of a preamplifier of the semiconductor memory device according to the third embodiment;

FIG. 30 is a graph showing current-voltage characteristics of a memory cell for describing the readout operation of the semiconductor memory device according to the third embodiment;

FIG. 31 is a specific waveform diagram of the readout operation of the semiconductor memory device according to the third embodiment;

FIG. 32 is a circuit diagram illustrating a preamplifier in the readout operation of the semiconductor memory device according to the third embodiment;

FIG. 35 is a circuit diagram illustrating the preamplifier in the readout operation of the semiconductor memory device according to the third embodiment;

FIG. 36 is a circuit diagram illustrating a basic configuration of a preamplifier of a semiconductor memory device according to a modified example of the third embodiment; and FIG. 37 is a specific waveform diagram of the readout operation of the semiconductor memory device according to the modified example of the third embodiment.

DETAILED DESCRIPTION

Figure 1:
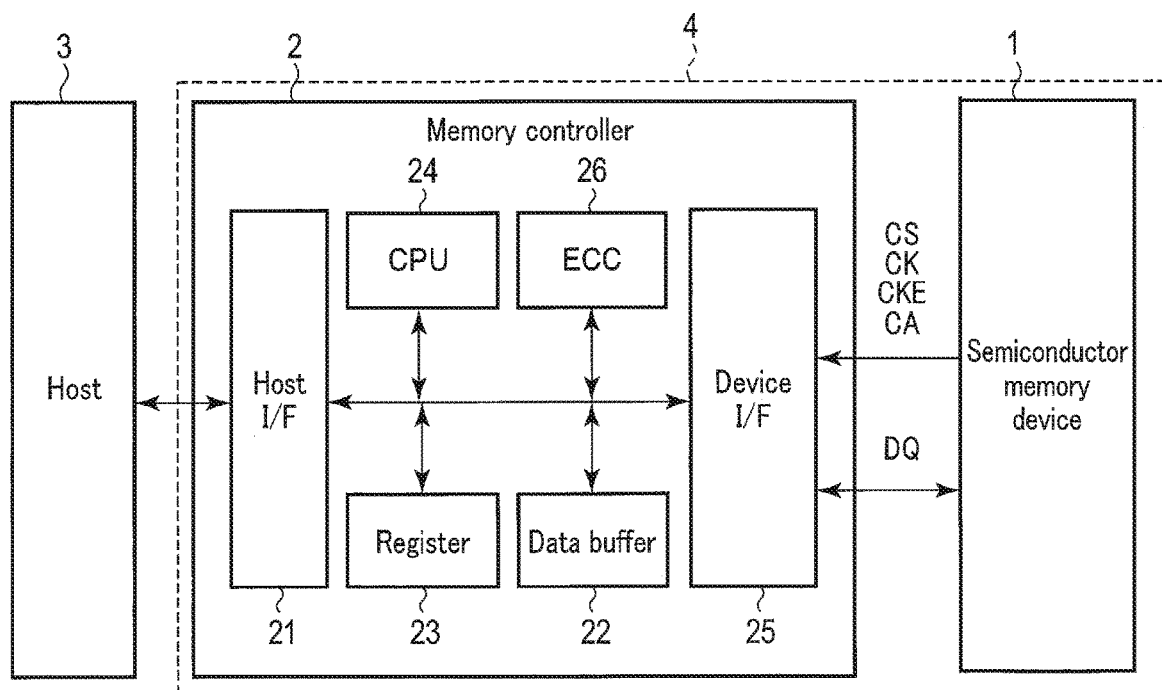
FIG. 1 is a block diagram illustrating a basic configuration of a memory system including a semiconductor memory device according to a first embodiment.

In generally, according to one embodiment, a semiconductor memory device, includes a memory cell comprising a switching element and a resistance change element; and a first circuit that applies a first voltage to the memory cell, places the memory cell into an ON state by applying a second voltage to the memory cell while applying the first voltage to the memory cell in parallel, generates a third voltage based on a resistance state of the resistance change element by performing first voltage application to perform a first readout on the memory cell in the ON state, writes first data into the memory cell, generates a fourth voltage based on a first data resistance state of the resistance change element by performing the first voltage application to perform a second readout on the memory cell in which the first data is written, and determines data stored in the memory cell at time of the first readout based on the third voltage and the fourth voltage.

The configured embodiments are described below with reference to the drawings. Note that, in the description below, components having the substantially same functions and configurations are denoted by the same reference characters.

It should be noted that the drawings are schematic, and the relationship between the thickness and the plane dimensions, the ratio between the thicknesses of layers, and the like are different from the actual relationship, ratio, and the like. Therefore, the specific thickness and dimensions are to be determined by taking the description below into consideration. Needless to say, parts of which relationships of the dimensions and ratios differ among the drawings are also included.

<1> First Embodiment

<1-1> Configuration

<1-1-1> Configuration of Memory System

With reference to FIG. 1, a basic configuration of a memory system including a semiconductor memory device according to a first embodiment is schematically described. A memory system 4 includes a semiconductor memory device 1 and a memory controller 2.

<1-1-2> Configuration of Memory Controller

The memory controller 2 receives orders from a host (external device) 3 such as a personal computer, to thereby read out data from the semiconductor memory device 1 and write data into the semiconductor memory device 1.

The memory controller 2 includes a host interface (I/F) 21, a data buffer 22, a register 23, a CPU 24, a device interface (I/F) 25, and an ECC circuit 26.

The host interface 21 is connected to the host 3. Transmission and reception of the data and the like is performed between the host 3 and the memory system 4 via the host interface 21.

The data buffer 22 is connected to the host interface 21. The data buffer 22 receives the data transmitted to the memory system 4 from the host 3 via the host interface 21, and temporarily stores the data therein. In addition, the data buffer 22 temporarily stores therein the data transmitted to the host 3 from the memory system 4 via the host interface 21. The data buffer 22 may be a volatile memory or a non-volatile memory.

The register 23 is a volatile memory, for example, and stores therein setting information, commands, statuses, and the like executed by the CPU 24. The register 23 may be a volatile memory or a non-volatile memory.

The CPU 24 is in charge of the entire operation of the memory system 4. The CPU 24 executes predetermined processing for the semiconductor memory device 1 in accordance with a command received from the host 3, for example.

The device interface 25 preforms transmission and reception of various signals and the like between the memory controller 2 and the semiconductor memory device 1.

The ECC circuit 26 receives write data received from the host 3 via the data buffer 22. Then, the ECC circuit 26 adds an error correcting code to the write data. The ECC circuit 26 supplies the write data to which the error correcting code is added to the data buffer 22 or the device interface 25, for example.

The ECC circuit 26 receives the data supplied from the semiconductor memory device 1 via the device interface 25. The ECC circuit 26 determines whether there is an error in the data received from the semiconductor memory device 1. When the ECC circuit 26 determines that there is an error in the received data, the ECC circuit 26 performs error correcting processing for the received data with use of the error correcting code. Then, the ECC circuit 26 supplies the data on which the error correcting processing has been performed to the data buffer 22, the device interface 25, and the like, for example.

<1-1-3> Semiconductor Memory Device

Figure 2:
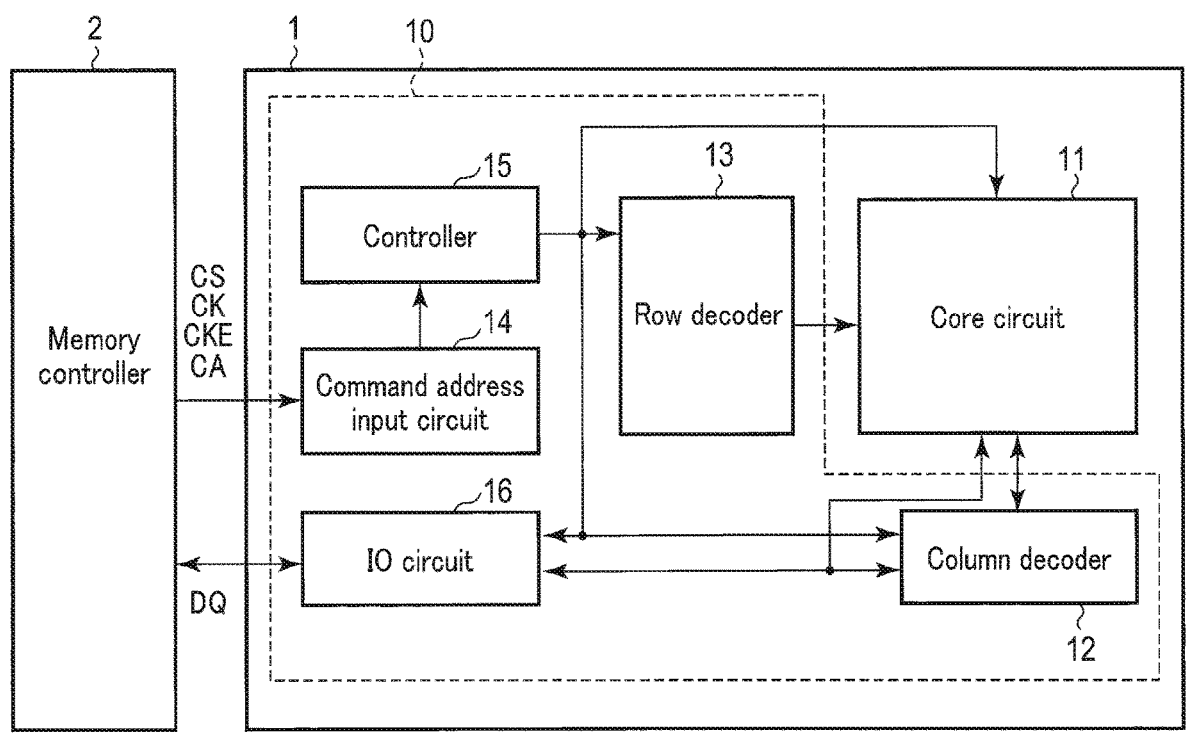
FIG. 2 is a block diagram illustrating a basic configuration of the semiconductor memory device according to the first embodiment.

With reference to FIG. 2, a basic configuration of the semiconductor memory device according to the first embodiment is schematically described.

As illustrated in FIG. 2, the semiconductor memory device 1 according to the first embodiment includes a peripheral circuit 10 and a core circuit 11.

The peripheral circuit 10 includes a column decoder 12, a row decoder 13, a command address input circuit 14, a controller 15, and an IO circuit 16.

On the basis of an external control signal, the column decoder 12 recognizes a command or an address by a command address signal CA and selects bit lines BL (global bit lines and local bit lines described below).

The row decoder 13 decodes the address of the command address signal CA supplied from the command address input circuit 14. More specifically, the row decoder 13 is configured so as to apply voltage to selected source lines SL (global source lines and local source lines described below) on the basis of a decoded row address when the data is read out or the data is written.

Various external control signals, for example, a chip select signal CS, a clock signal CK, a clock enable signal CKE, a command address signal CA, and the like are input to the command address input circuit 14 from the memory controller 2. The command address input circuit 14 transfers the command address signal CA to the controller 15.

The controller 15 identifies the command and the address. The controller 15 controls the semiconductor memory device 1.

The IO circuit 16 temporarily stores therein input data input from the memory controller 2 via a data line DQ or output data read out from a selected memory cell. The input data is written into a memory cell of a selected memory cell.

<1-1-4> Core Circuit

Figure 3:
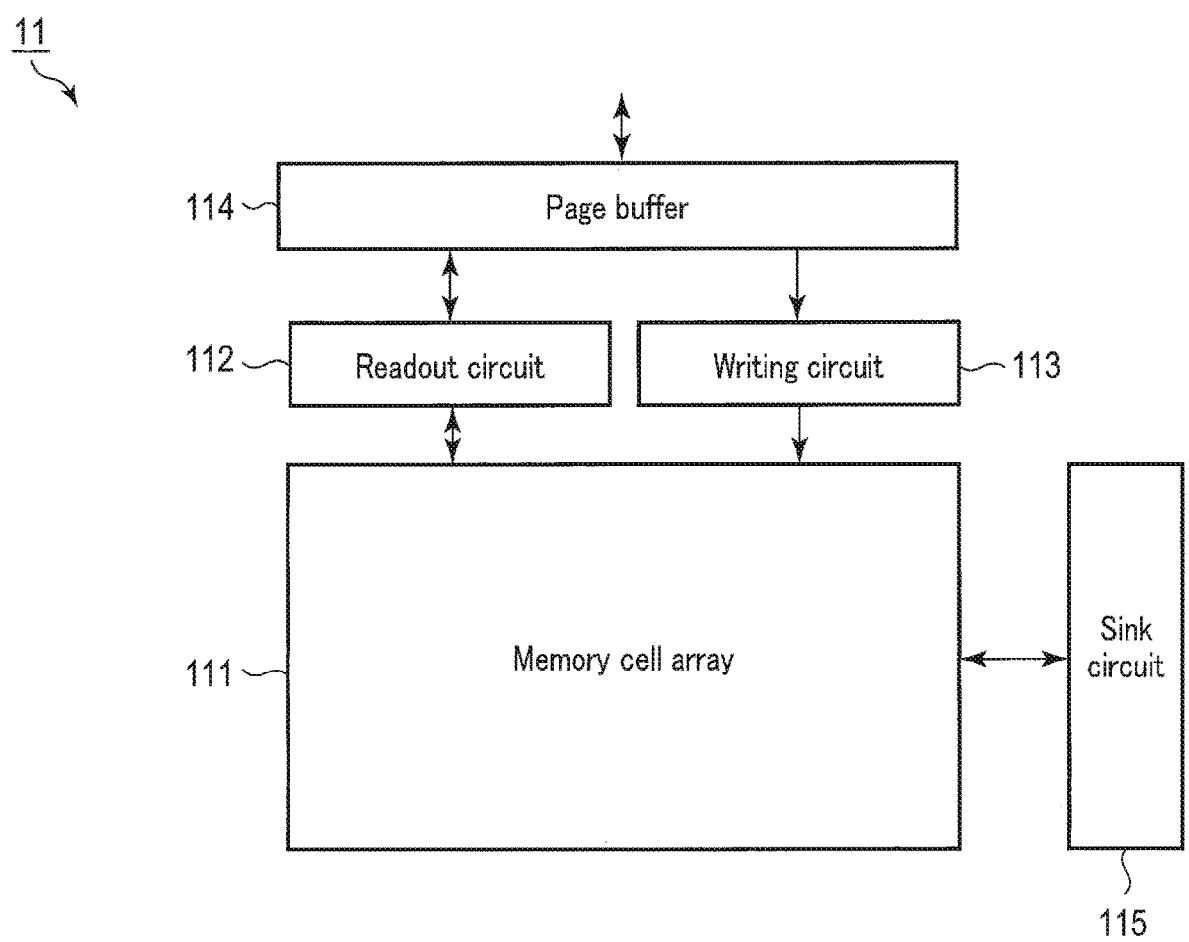
FIG. 3 is a block diagram illustrating a basic configuration of a core circuit of the semiconductor memory device according to the first embodiment.

With reference to FIG. 3, a basic configuration of the core circuit 11 of the semiconductor memory device according to the first embodiment is schematically described.

As illustrated in FIG. 3, the core circuit 11 includes a memory cell array 111, a readout circuit 112, a writing circuit 113, a page buffer 114, and a sink circuit 115.

The memory cell array 111 is formed by a plurality of memory cells MC disposed in a matrix. In the memory cell array 111, the plurality of bit lines BL and the plurality of source lines SL are arranged. One column of the memory cell array 111 is connected to one bit line BL, and one row of the memory cell array 111 is connected to one source line SL.

The memory cell MC is formed by a magnetoresistance effect element (MTJ (Magnetic Tunnel Junction) element) and a selector. The memory cell MC has one end connected to a local bit line LBL and another end connected to a local source line LSL.

The readout circuit 112 is connected to the local bit line LBL via the global bit line GEL, and detects the current flowing through the memory cell MC, to thereby read out the data stored in the memory cell MC. The writing circuit 113 is connected to the local bit line LBL via the global bit line GBL or is connected to the local source line LSL via the global source line GSL, and writes data by causing current to flow through the memory cell MC. The giving and reception of data between the readout circuit 112 and the writing circuit 113 and the data line DQ are performed via the page buffer 114 and the IO circuit 16.

The page buffer 114 temporarily holds the data read out from the readout circuit 112 or the write data received from the memory controller 2. Data is written in the memory cell array 111 in units of a plurality of memory cells (units of pages).

The sink circuit 115 is connected to the local source line LSL via the global source line GSL, and causes the electric potential of the local source line LSL to be Vss.

<1-1-5> Memory Cell Array

Next, with reference to FIG. 4, the memory cell array 111 of the semiconductor memory device according to the first embodiment is described in more detail.

As illustrated in FIG. 4, the memory cell array 111 includes a plurality of sub memory cell arrays 1110 arranged in a matrix.

The sub memory cell array 1110 includes a MAT 1111, a column switch circuit (CSWC) 1112, and a row switch circuit (RSWC) 1113.

The MAT 1111 includes a plurality of memory cells MC arranged in a matrix on a semiconductor substrate. Details are described below.

The column switch circuit 1112 controls the connection of the global bit line GEL and the local bit line LBL on the basis of signals from the column decoder 12.

The row switch circuit 1113 controls the connection of the global source line GSL and the local source line LSL on the basis of signals from the controller 15.

<1-1-6> Readout Circuit

Figure 5:
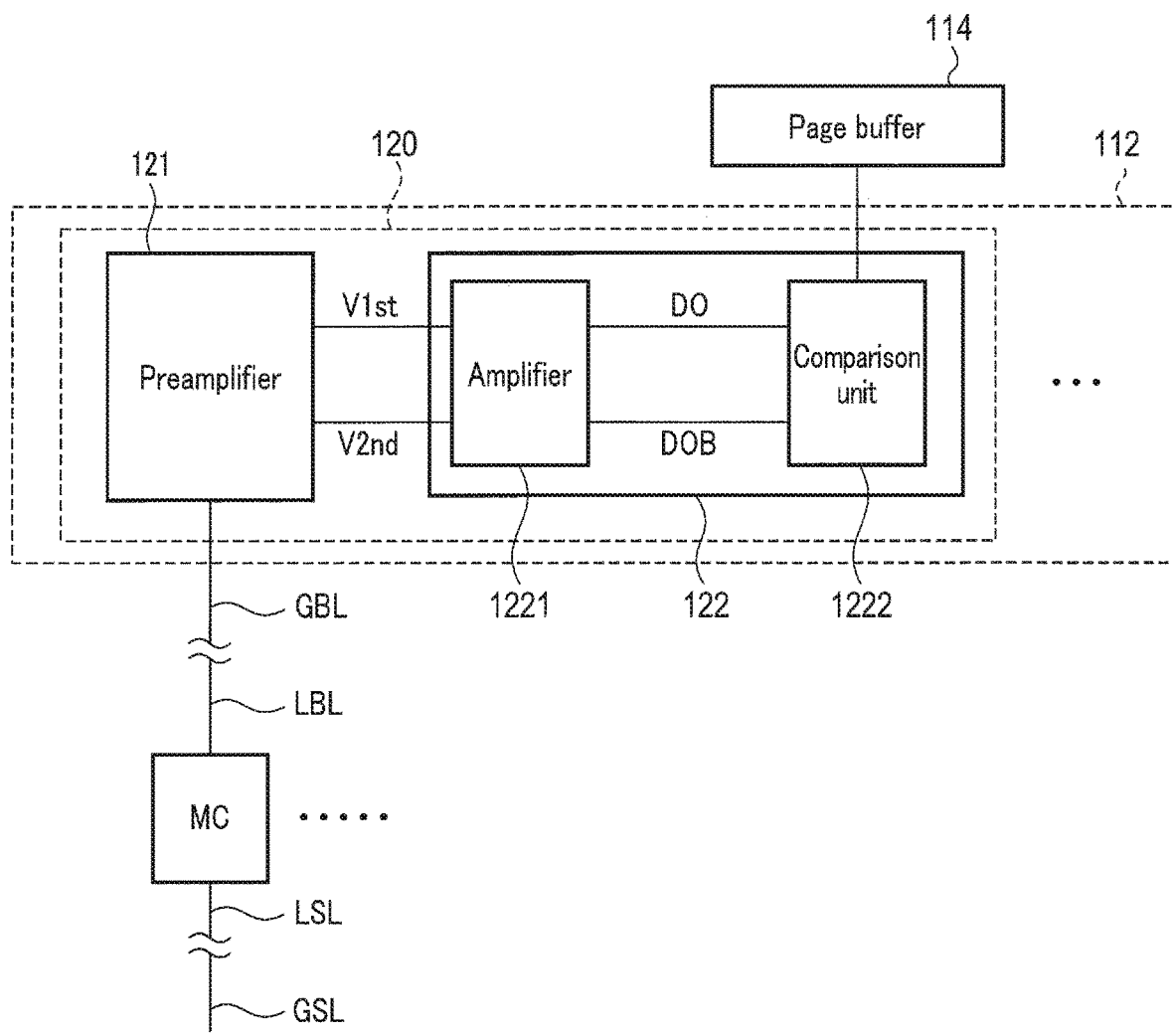
FIG. 5 is a block diagram illustrating a basic configuration of a readout circuit of the semiconductor memory device according to the first embodiment.

With reference to FIG. 5, the readout circuit 112 of the semiconductor memory device according to the first embodiment is described.

As illustrated in FIG. 5, the readout circuit 112 includes a sense amplifier unit 120 for each of the global bit lines GBL.

The sense amplifier unit 120 includes a preamplifier 121 and a sense amplifier 122.

The preamplifier 121 supplies current or voltage to the memory cell MC via the global bit line GBL, and generates a voltage V1st and a voltage V2nd.

The sense amplifier 122 includes an amplifier 1221 and a comparison unit 1222.

The amplifier 1221 amplifies a voltage difference between the voltage V1st and the voltage V2nd generated by the preamplifier 121. Then, the amplifier 1221 generates a signal DO and a signal DOB (an inverted signal of DO) as the amplification result.

The comparison unit 1222 compares the voltage difference between the signal DO and the signal DOB generated by the amplifier 1221, and outputs the comparison result to the page buffer 114 as the data stored in the memory cell MC.

<1-1-7> Configuration of Preamplifier

Next, with reference to FIG. 6, a configuration of the preamplifier 121 of the semiconductor memory device according to the first embodiment is described. Note that the preamplifier 121 described in the first embodiment is a type of preamplifier that is referred to as a "constant voltage type", and is a circuit that applies constant voltage to the memory cell MC and takes out a signal (current) in accordance with the voltage.

As illustrated in FIG. 6, the preamplifier 121 includes PMOS transistors M1, M2, M7, and M10, NMOS transistors M3, M4, M5, M6, MB, M9, and M11, and capacitors CP1 and CP2.

The transistor M1 has one end to which a power supply voltage VDD is applied, and the other end and a gate electrode that are connected to a node N1.

The transistor M2 has one end to which the power supply voltage VDD is applied, the other end connected to a node N5, and a gate electrode connected to the node N1.

The transistor M3 has one end connected to the node N1, the other end connected to a node N2, and a gate electrode to which a signal CLAMP is supplied.

The transistor M4 has one end connected to the node N2, the other end connected to a node N3 (global bit line), and agate electrode to which a signal REN is supplied.

The transistor M5 has one end to which the power supply voltage VDD is applied, the other end connected to the node N4, and a gate electrode to which a signal BUMP is supplied.

The transistor M6 has one end connected to the node N4, the other end connected to the node N3 (global bit line), and a gate electrode to which a signal BEN is supplied.

The transistors M5 and M6 function as a booster for placing the selected memory cell MC into an ON (conductive) state. Details are described below.

The transistor M7 has one end connected to the node N5, the other end connected to a node N6, and a gate electrode to which a signal SW1B is supplied.

The transistor M8 has one end connected to the node N5, the other end connected to the node N6, and a gate electrode to which a signal SW1P is supplied.

The transistor M7 and the transistor M8 function as a switch.

The transistor M9 has one end connected to the node N5, another end to which a ground voltage Vss is applied, and a gate electrode connected to the node N6.

The capacitor CP1 has one end connected to the node N6, and the other end to which the ground voltage Vss is applied.

The electric potential of the node N6 is supplied to the amplifier 1221 as the voltage V1st. The transistors M7, M8, and M9, the capacitor CP1, and the node N6 can be conceived as a V1st generating unit.

The transistor M10 has one end connected to the node N5, the other end connected to a node N7, and a gate electrode to which the signal SW2B is supplied.

The transistor M11 has one end connected to the node N5, the other end connected to the node N7, and a gate electrode to which a signal SW2P is supplied.

The transistor M10 and the transistor M11 function as a switch.

The capacitor CP2 has one end connected to the node N7, and the other end to which the ground voltage Vss is applied.

The electric potential of the node N7 is supplied to the amplifier 1221 as the voltage V2nd. The transistors M9, M10, and M11, the capacitor CP2, and the node N7 can be conceived as a V2nd generating unit.

<1-1-8> Amplifier

Figure 7:
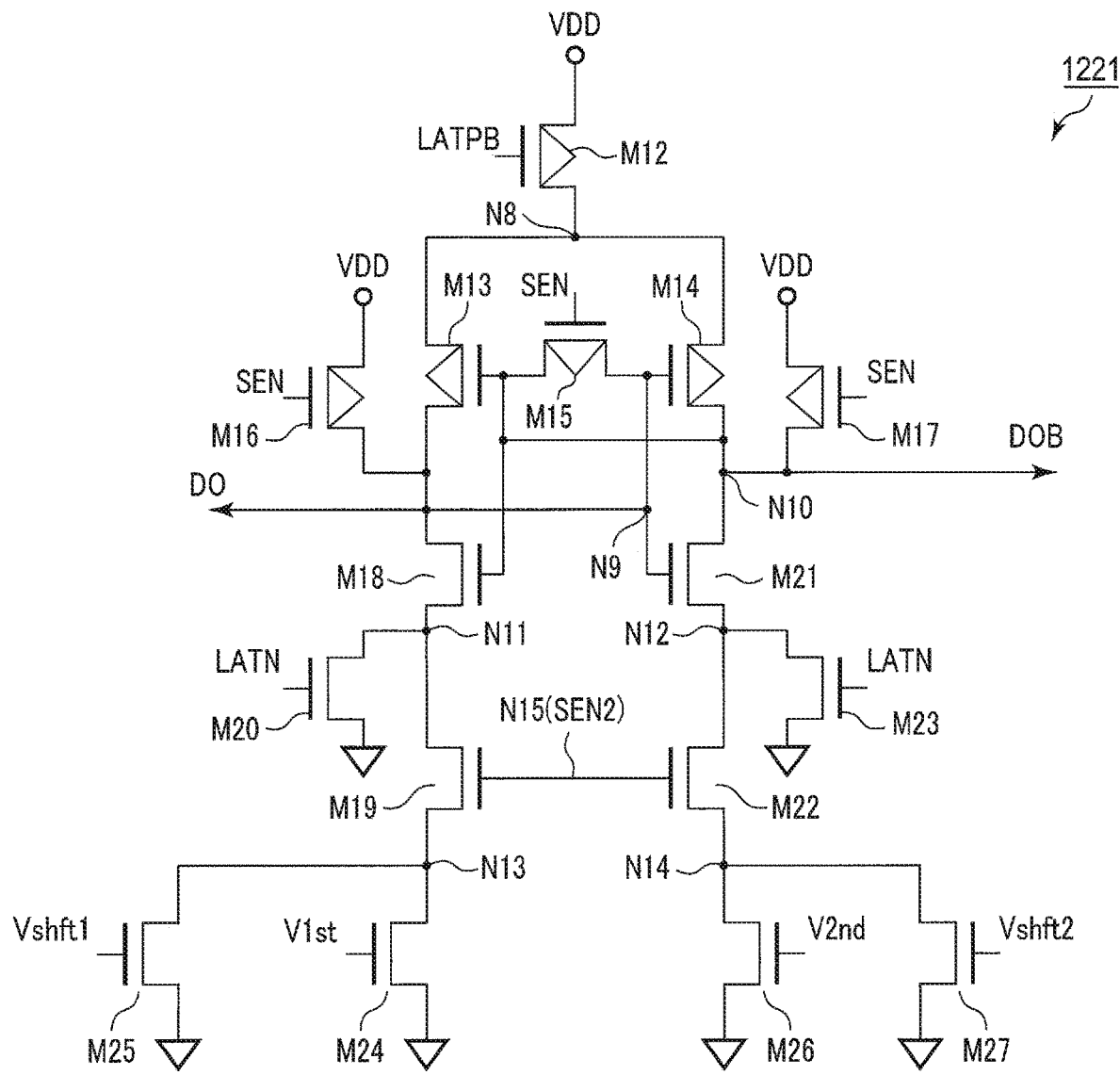
FIG. 7 is a circuit diagram illustrating a basic configuration of an amplifier of the semiconductor memory device according to the first embodiment.

Next, with reference to FIG. 7, a configuration of the amplifier 1221 of the semiconductor memory device according to the first embodiment is described.

As illustrated in FIG. 7, the amplifier 1221 includes PMOS transistors M12, M13, M14, M15, M16, and M17, and NMOS transistors M18, M19, M20, M21, M22, M23, M24, M25, M26, and M27.

The transistor M12 has one end to which the power supply voltage VDD is applied, the other end connected to a node N8, and a gate electrode to which a signal LATPB is supplied.

The transistor M13 has one end connected to the node N8, the other end connected to a node N9, and a gate electrode connected to a node N10.

The transistor M14 has one end connected to the node N8, the other end connected to the node N10, and a gate electrode connected to the node N9.

The transistor M15 has one end connected to the node N9, the other end connected to the node N10, and a gate electrode to which a signal SEN is supplied.

The transistor M16 has one end to which the power supply voltage VDD is applied, the other end connected to the node N9, and a gate electrode to which the signal SEN is supplied.

The transistor M17 has one end to which the power supply voltage VDD is applied, the other end connected to the node N10, and a gate electrode to which the signal SEN is supplied.

The transistor M18 has one end connected to the node N9, the other end connected to a node N11, and a gate electrode connected to the node N10.

The transistor M19 has one end connected to the node N11, the other end connected to a node N13, and a gate electrode to which a signal SEN2 is supplied via a node N15.

The transistor M20 has one end connected to the node N11, the other end to which the ground voltage Vss is applied, and a gate electrode to which a signal LATN is applied.

The transistor M21 has one end connected to the node N10, the other end connected to a node N12, and a gate electrode connected to the node N9.

The transistor M22 has one end connected to the node N12, the other end connected to a node N14, and a gate electrode to which the signal SEN2 is supplied via the node N15.

The transistor M23 has one end connected to the node N12, another end to which the ground voltage Vss is applied, and a gate electrode to which the signal LATN is applied.

The transistor M24 has one end connected to the node N13, the other end to which the ground voltage Vss is applied, and a gate electrode to which a signal V1st is supplied.

The transistor M25 has one end connected to the node N13, the other end to which the ground voltage Vss is applied, and a gate electrode to which a signal Vshft1 is supplied.

The transistor M26 has one end connected to the node N14, the other end to which the ground voltage Vss is applied, and a gate electrode to which a signal V2nd is supplied.

The transistor M27 has one end connected to the node N14, the other end to which the ground voltage Vss is applied, and a gate electrode to which a signal Vshft2 is supplied.

The electric potential of the node N9 is supplied to the comparison unit 1222 as the signal DO.

The electric potential of the node N10 is supplied to the comparison unit 1222 as DOB (an inverted signal of DO).

<1-1-9> MAT

Figure 8:
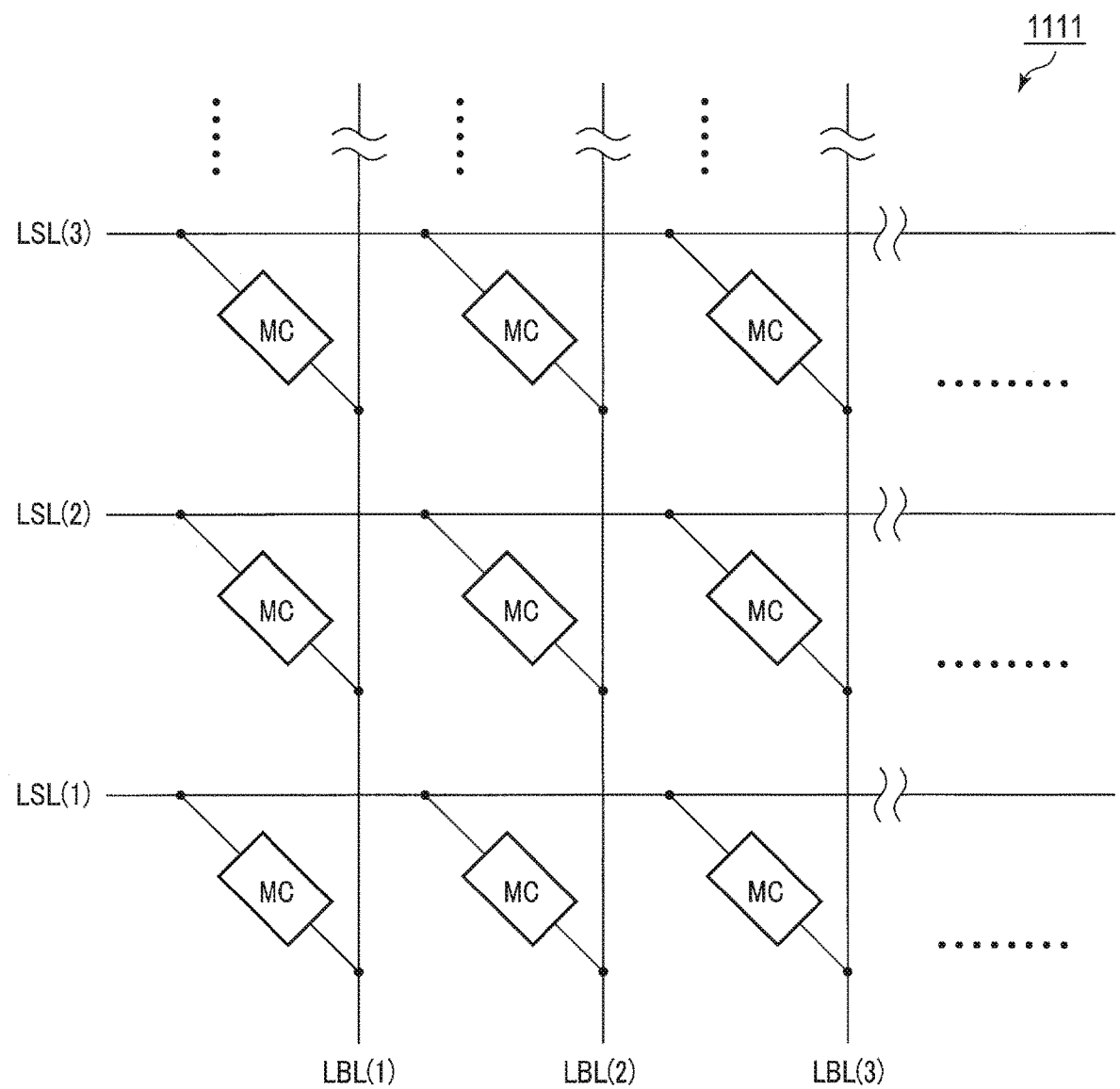
FIG. 8 is a circuit diagram illustrating a basic configuration of a memory cell (hereinafter MAT) of the semiconductor memory device according to the first embodiment.

Next, with reference to FIG. 8, the MAT 1111 of the semiconductor memory device according to the first embodiment is described. FIG. 8 is a circuit diagram illustrating the MAT 1111 of the semiconductor memory device according to the first embodiment.

As illustrated in FIG. 8, the MAT 1111 includes a plurality of memory cells MC arranged in a matrix on a semiconductor substrate. Note that the number of the memory cells MC may be freely selected. The memory cells MC arranged in the same column are commonly connected to any local bit line LBLk (k is an integer equal to or more than 0). The memory cells MC arranged in the same row are commonly connected to any local source line LSLm (m is an integer equal to or more than 0). The memory cell MC includes an MTJ and a selector.

<1-1-10> Memory Cell MC

<1-1-10-1> Outline

<1-1-10-1> First Example

Figure 9:
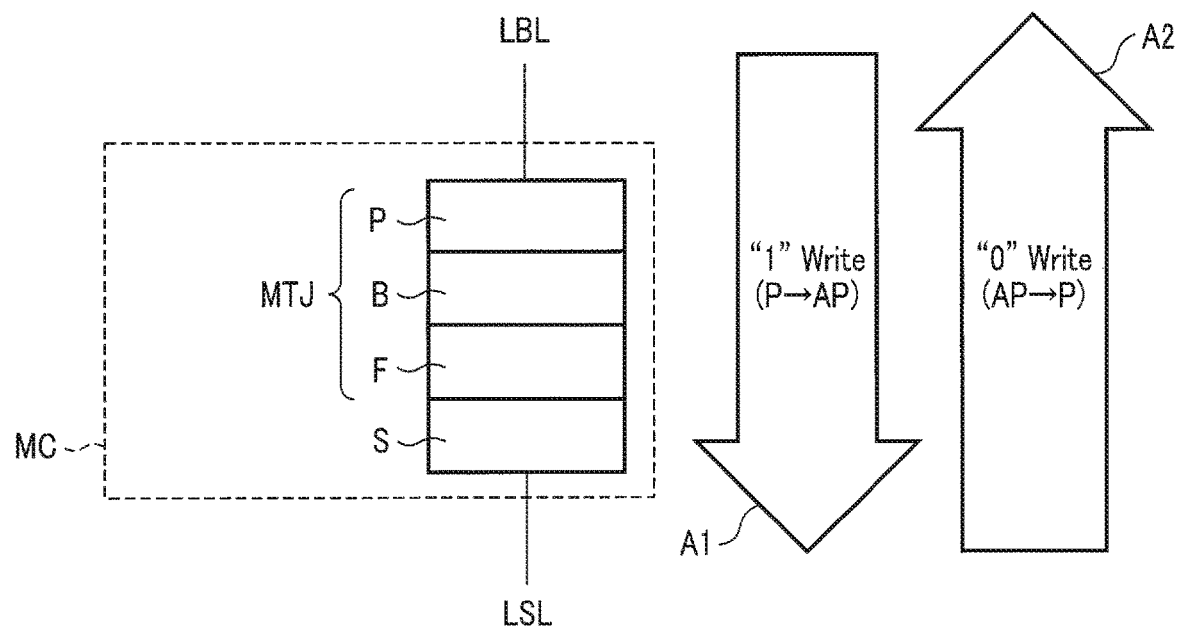
FIG. 9 is a block diagram illustrating a first example of a configuration of a memory cell of the semiconductor memory device according to the first embodiment.

Next, with reference to FIG. 9, a first example of a configuration of the memory cell MC of the semiconductor memory device according to the first embodiment is schematically described. As illustrated in FIG. 9, an MTJ element of the memory cell MC according to the first embodiment has one end connected to the local bit line LBL, and the other end connected to one end of a selector S. The other end of the selector S is connected to the local source line LSL. The MTJ element utilizing the TMR (tunneling magneto-resistive) effect has a layered structure formed by two ferromagnetic layers F and P and a non-magnetic layer (tunnel insulating film) B that is sandwiched therebetween, and stores digital data therein in accordance with the change of the magnetic resistance by the spin-polarized tunneling effect. The MTJ element may be placed in a low-resistance state and the high-resistance state in accordance with the magnetic ordering of the two ferromagnetic layers F and P. For example, when the low-resistance state is defined as data "0" and the high-resistance state is defined as data "1", one-bit data can be stored in the MTJ element. Needless to say, the low-resistance state may be defined as data "1" and the high-resistance state may be defined as data "0".

For example, the MTJ element is formed by sequentially layering a storing layer (a free layer, a storing layer) F, a non-magnetic layer B, and a reference layer (a pin layer, a fixed layer) P. The reference layer P and the storing layer F are formed by ferromagnetic bodies, and the non-magnetic layer B is formed by an insulating film (for example, $Al_2O_3$ or MgO). The reference layer P is a layer in which the magnetization direction is fixed. The magnetization direction of the storing layer F is variable, and the storing layer F stores data therein in accordance with the direction of the magnetization.

When the current is caused to flow in the direction of arrow A1 at the time of writing, the direction of magnetization of the free layer F is placed into an antiparallel state (AP state) with respect to the direction of magnetization of the pin layer P, and is placed into a high-resistance state (data "1"). When current is caused to flow in the direction of arrow A2 at the time of writing, the direction of magnetization of the pin layer P and the free layer F is placed into a parallel state (P state) and is placed into a low-resistance state (data "0"). As described above, in the MTJ element, different data can be written in accordance with the direction in which the current flows. The expression of "the magnetization direction is variable" described above means that the magnetization direction changes with respect to a predetermined write current. The expression of "the magnetization direction is fixed" described above means that the magnetization direction does not change with respect to a predetermined write current.

The selector S in this embodiment is a two-terminal switching element, for example. When the voltage applied across the two terminals is equal to or less than a threshold value, the switching element is in an "OFF" state, for example, an electrically high-resistance state. When the voltage applied across the two terminals is equal to or more than a threshold value, the switching element changes to an "ON" state, for example, an electrically low-resistance state. The switching element may have the function for either of the polarities of the voltage. For example, the switching element may include, for example, as an example, at least one type of chalcogen element selected from a group consisting of Te, Se, and S. Alternatively, for example, a chalcogenide that is a compound including the above-mentioned chalcogen element may be included. The switching element may include, for example, As-doped $SiO_2$ and the like that are not chalcogenide based.

<1-1-10-1-2> Second Example

Figure 10:
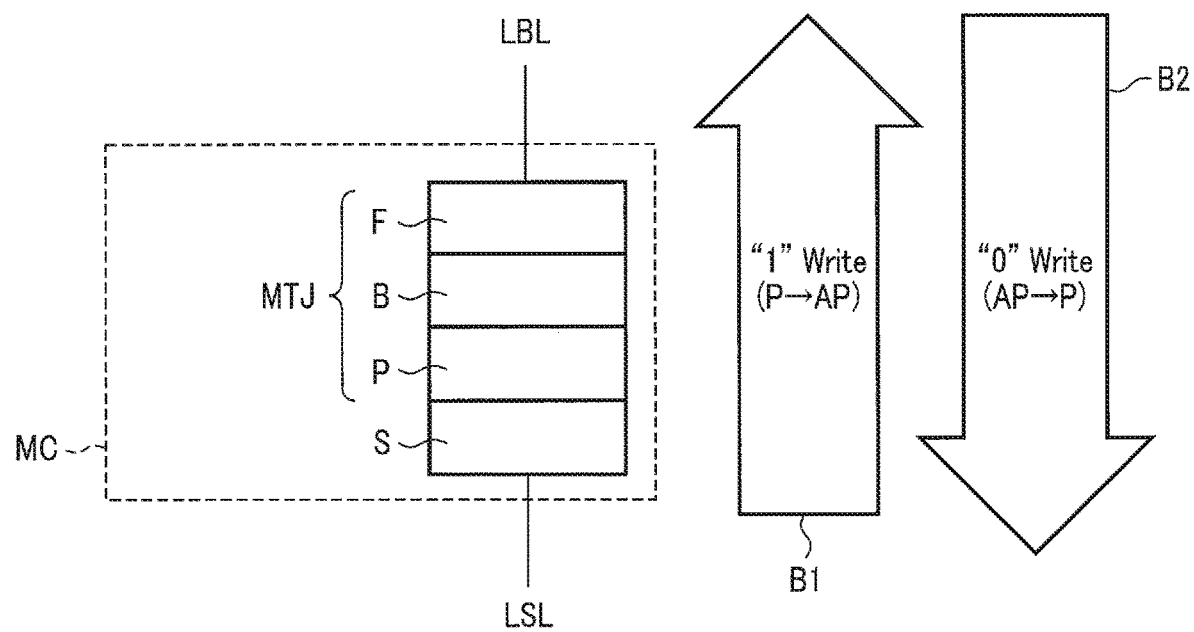
FIG. 10 is a block diagram illustrating a second example of a configuration of the memory cell of the semiconductor memory device according to the first embodiment.

Next, with reference to FIG. 10, a second example of a configuration of the memory cell MC of the semiconductor memory device according to the first embodiment is schematically described. Only the differences from the first example are described below. As illustrated in FIG. 10, in the second example, the MTLT element is formed by sequentially layering a reference layer (a pin layer, a fixed layer) P, a non-magnetic layer B, and a storing layer (a free layer, a storing layer) F.

When current is caused to flow in the direction of arrow B1 at the time of writing, the direction of magnetization of the free layer F is placed into an antiparallel state (AP state) with respect to the direction of magnetization of the pin layer P, and is placed into a high-resistance state (data "1"). When current is caused to flow in the direction of arrow B2 at the time of writing, the direction of magnetization of the pin layer P and the free layer F is placed into a parallel state (P state) and is placed into a low-resistance state (data "0").

Note that the configuration of the memory cell MC is described below for the semiconductor memory device on the basis of the first example.

<1-1-10-2> Characteristics of Selector

Figure 11:
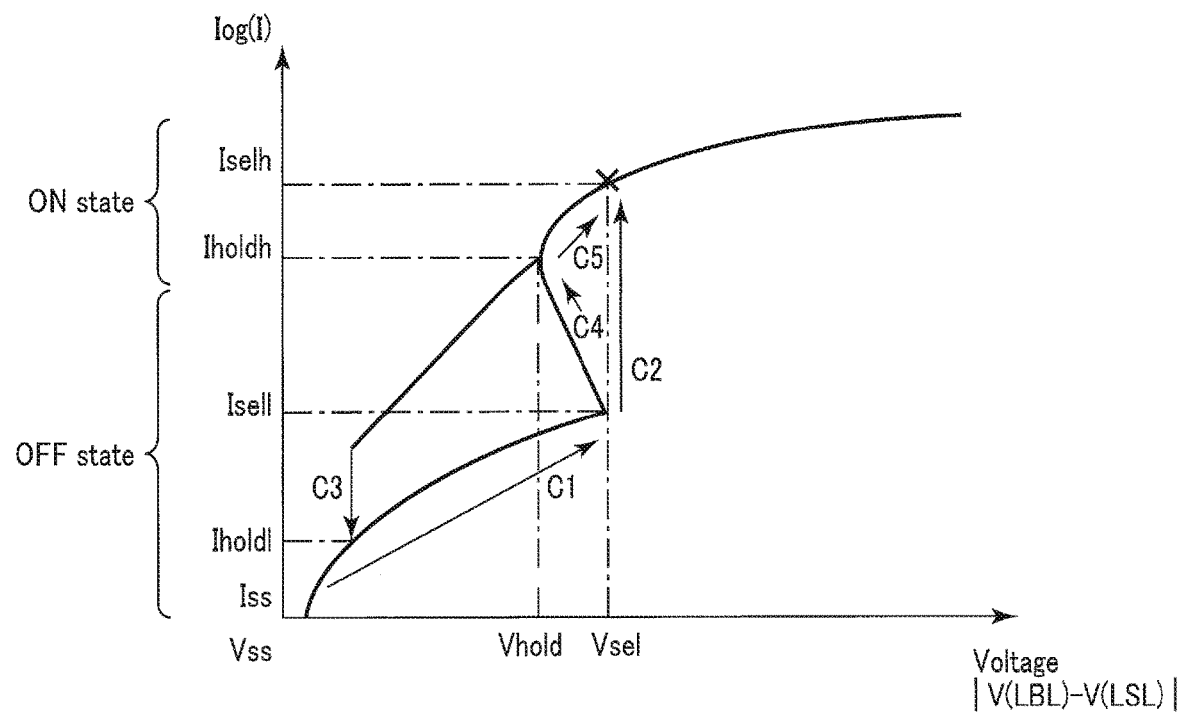
FIG. 11 is a graph showing current-voltage characteristics of a selector of the memory cell of the semiconductor memory device according to the first embodiment.

Next, with reference to FIG. 11, current-voltage (I-V) characteristics of the selector S of the semiconductor memory device according to the first embodiment is described. FIG. 11 is a graph showing the I-V characteristics of the selector S. The horizontal axis is voltage (a difference between a voltage V (LBL) of the local bit line and a voltage V (LSL) of the local source line) applied to the selector S, and the vertical axis is current (selector current) flowing through the selector S. The vertical axis is also a Log scale.

First, the characteristics of the selector S when voltage is applied to the selector S is described. The selector S has a characteristic called snapback. As shown in FIG. 11, the current increases along arrow C1 until the voltage applied to the selector S exceeds a voltage Vsel. Then, when the voltage applied to the selector S exceeds the voltage Vsel, the selector current suddenly increases (arrow C2) from a current Isell to a current Iselh (>>Isell). Then, when the voltage applied to the selector S is stepped down and becomes less than a voltage Vhold, the selector current suddenly decreases (arrow C3) from a current Iholdh to a current Iholdl (>>Iholdh). The selector terminal voltage is smaller than the application voltage due to, for example, the transistor resistance and contact resistance, such as 1113 (RSWC) and CSWC(1112) in FIG. 4 and M6 and M4 in FIG. 6.

Now, a state in which the selector S causes a current that is equal to or more than 0, which is obtained when the electric potential difference is 0 V when a bit line electric potential is Vss with respect to a word line electric potential being Vss, and less than the current Iholdh to flow is defined as an "OFF state", and a state in which the selector S causes a current equal to or more than the current Iholdh to flow is defined as an "ON state". In other words, an ON state is obtained when a voltage equal to or more than the voltage Vsel is applied to the selector S, and an OFF state is obtained when a voltage less than the voltage Vhold is applied to the selector S thereafter.

Next, the characteristics of the selector S when current is applied to the selector S is described. As shown in FIG. 11, the voltage applied to the selector S is stepped up (arrow C1) until the selector current reaches the current Isell from a current Iss (the current flowing into the word line electric potential Vss). When the selector current reaches the current Isell, the voltage applied to the selector S is stepped down (arrow C4) until the current reaches the current Iholdh. Then, when the current exceeds current Iholdh, the voltage applied to the selector S is stepped up again (arrow C5).

<1-1-10-3> Characteristics of Memory Cell

Figure 12:
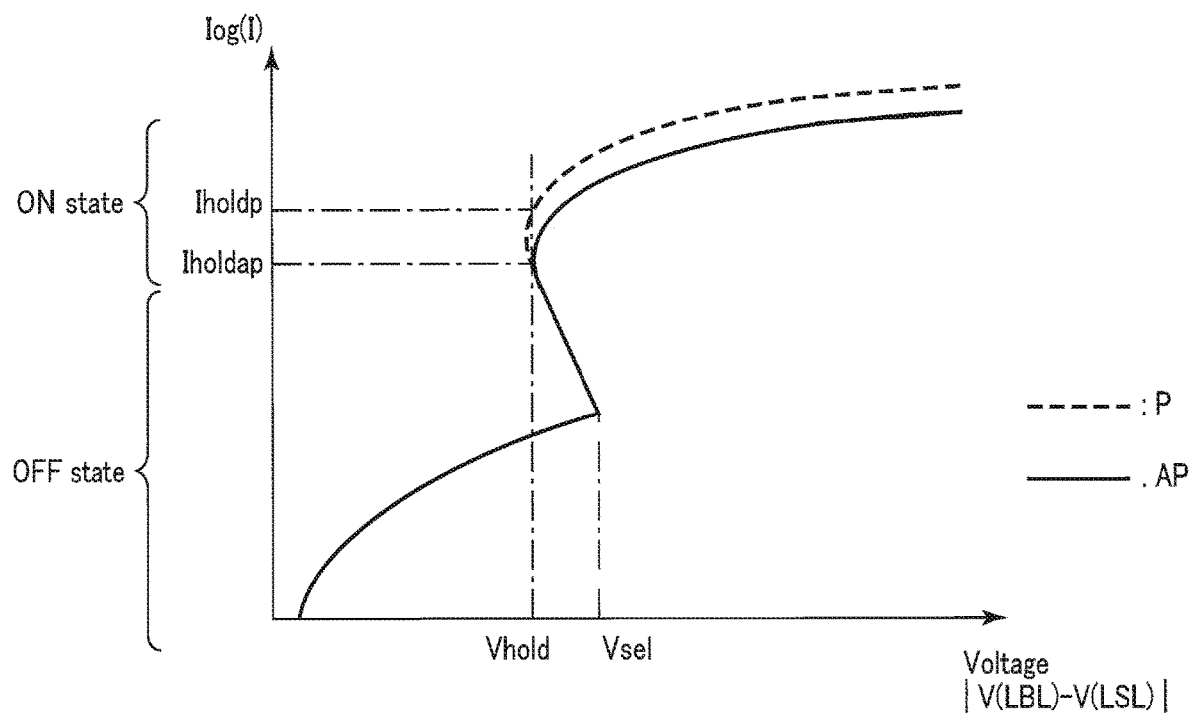
FIG. 12 is a graph showing current-voltage characteristics of the memory cell of the semiconductor memory device according to the first embodiment.

Next, with reference to FIG. 12, current-voltage (I-V) characteristics when the selector S and the MTJ element of the semiconductor memory device according to the first embodiment are combined is described.

FIG. 12 shows the current-voltage characteristics when the MTJ element and the selector S are combined. The current-voltage characteristics slightly differ in accordance with the resistance state of the MTJ element. However, the general current-voltage characteristics when the MTJ element and the selector S are combined are similar to the current-voltage characteristics of the selector S described above. The current-voltage characteristics when the MTJ element and the selector S are combined are hereinafter referred to as the current-voltage characteristics of the memory cell.

When the memory cell MC is in a P state, a low-resistance state is obtained. When the memory cell MC is in an AP state, a high-resistance state is obtained. Therefore, for example, the current-voltage characteristics in the ON state differ in accordance with the data. For example, as shown in FIG. 12, when the memory cell MC is in an ON state and the voltage Vhold is applied, a current Iholdp flows through the memory cell MC in a P state and a current Iholdap (<Iholdp) flows through the memory cell MC in an AP state.

The readout and the write from and into the memory cell MC are performed in an ON state.

It is thought that the probability of the magnetization reversal of the MTJ element by the spin transfer torque can be represented as a simple thermal activity process. So, it is desirable to suppress the peak electric current for disturb reduction at short time (See, for example, Z. Li and S. Zhang, Physical Review B, Vol. 69, 134416 (2004)).

<1-1-11> Definitions of Selected Memory Cell MC, Non-Selected Memory Cell MC, and Half-Selected Memory Cell MC Now, with reference to FIG. 13, the definitions of the selected memory cell MC, the non-selected memory cell MC, and the half-selected memory cell MC are described. FIG. 13 is a circuit diagram illustrating the selected memory cell MC, the non-selected memory cells MC, and the half-selected memory cells MC.

As illustrated in FIG. 13, the selected memory cell MC is a memory cell MC to be read out. The local bit line LBL connected to the selected memory cell MC is referred to as a selected local bit line LBL. The local source line LSL connected to the selected memory cell MC is referred to as a selected local source line LSL.

As illustrated in FIG. 13, the non-selected memory cell MC is a memory cell MC that is not connected to either of the selected local bit line LBL and the selected local source line LSL. The local bit line LBL connected to the non-selected memory cell MC is referred to as a non-selected local bit line LBL. The local source line LSL connected to the non-selected memory cell MC is referred to as a non-selected local source line LSL.

As illustrated in FIG. 13, the half-selected memory cell MC is a memory cell. MC that is not a memory cell MC to be read out but is connected to either one of the selected local bit line LBL or the selected local source line LSL. Now, the memory cell MC connected to the selected local bit line LBL and the non-selected local source line LSL is referred to as a first half-selected memory cell MC. The memory cell MC connected to the non-selected local bit line LBL and the selected local source line LSL is referred to as a second half-selected memory cell MC.

<1-2> Operation

As described above, the MTJ elements of the semiconductor memory device according to the first embodiment stores therein data with use of the change of resistance values. When the semiconductor memory device reads out information stored in the MTJ elements as above, the semiconductor memory device causes a readout current (also referred to as a cell current) to flow through the MTJ elements. Then, the semiconductor memory device can determine the resistance state by converting the resistance values of the MTJ elements to current values or voltage values and comparing the values with a reference value.

However, when the resistance variation of the MTJ elements increases, the intervals in the resistance value distribution of the "0" state and the "1" state may become small. Therefore, the readout margin significantly decreases with a readout method of setting a reference value among the resistance value distribution and determining the states of the MTJ elements on the basis of whether the value is larger or smaller than the reference value.

Thus, in the first embodiment, the reference signal is obtained by adding shift signal information to signal information (a current value or a voltage value) on one resistance state out of the "0" state and the "1" state of the MTJ element. A self-referencing readout method for determining the initial state of the MTJ element on the basis of the reference signal is described.

Next, the readout operation of the semiconductor memory device according to the first embodiment is described.

<1-2-1> Outline of Readout Operation

Figure 14:
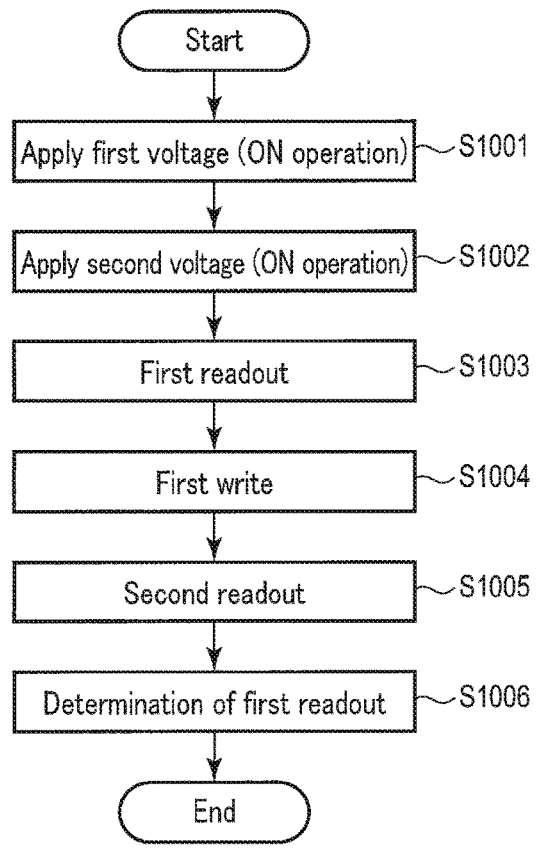
FIG. 14 is a flowchart for describing a readout operation of the semiconductor memory device according to the first embodiment.
Figure 15:
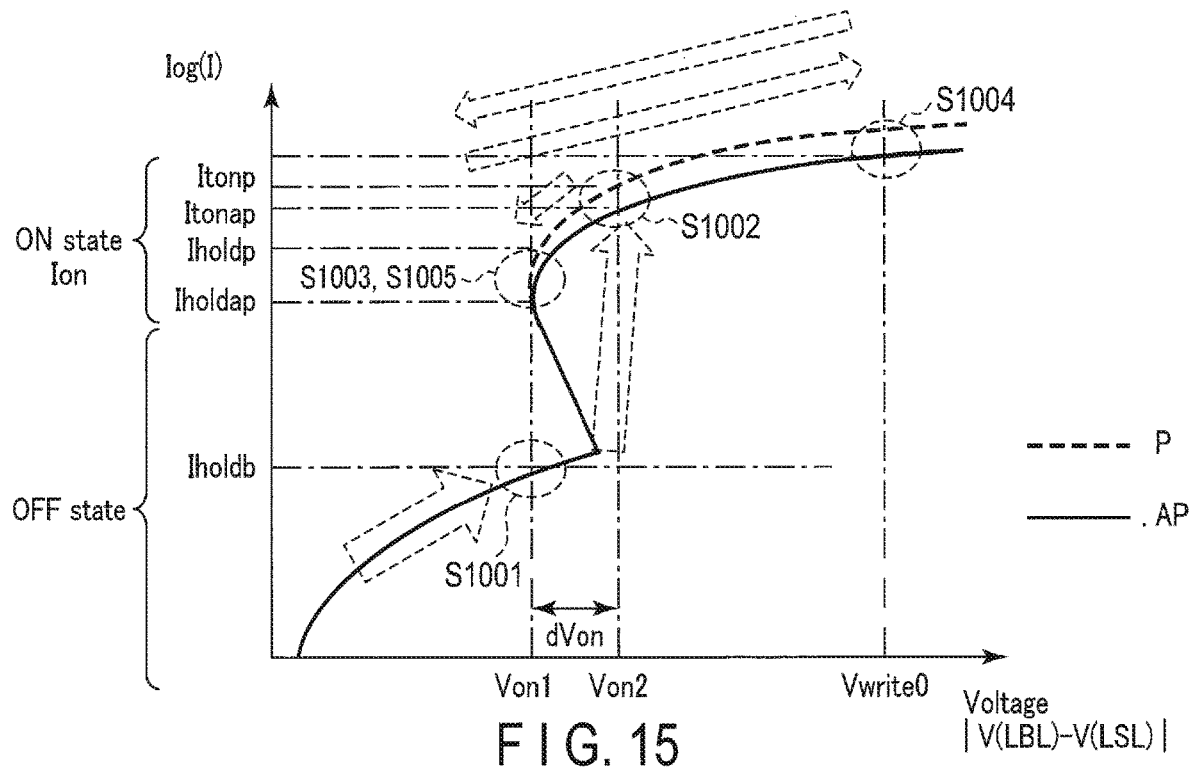
FIG. 15 is a graph showing current-voltage characteristics of the memory cell for describing the readout operation of the semiconductor memory device according to the first embodiment.

With reference to FIG. 14 and FIG. 15, an outline of the readout operation of the semiconductor memory device according to the first embodiment is described.

[Step S1001]

When the memory controller 2 receives a readout order (host command) from the host 3, the memory controller 2 issues an active command and a readout command to the semiconductor memory device 1.

When the semiconductor memory device 1 receives the active command and the readout command from the memory controller 2, the semiconductor memory device 1 performs an operation (ON operation) for placing the selector (selected selector) of the selected memory cell MC to be read out into an ON state. Specifically, the controller 15 applies a first voltage to the selected memory cell MC. As a result, as shown in FIG. 15, the current (cell current) flowing through the memory cell MC becomes a current Iholdb (OFF state). Note that the expression of "placing the selector of the selected memory cell MC into an ON state" is hereinafter referred to as the expression of "placing the selected memory cell MC into an ON state" for the sake of convenience.

[Step S1002]

As shown in FIG. 15, with the operation of Step S1001, the selected memory cell MC is not placed into an ON state. Thus, the semiconductor memory device 1 applies a second voltage that is higher than the first voltage to the selected memory cell MC as an operation (ON operation) for placing the selected memory cell MC into an ON state. As shown in FIG. 15, by applying the second voltage to the selected memory cell MC, the voltage becomes higher than the voltage Vsel. Therefore, the current flowing through the selected memory cell MC becomes Ion (ON state).

Note that the second voltage is applied for an extremely short amount of time (an amount of time that is shorter than other steps). Then, the voltage applied to the selected memory cell MC is maintained at the first voltage thereafter. The first voltage is a voltage equal to or more than Vhold at which the ON state of the selected memory cell MC is maintained.

[Step S1003]

The semiconductor memory device 1 keeps a state in which the first voltage is applied to the selected memory cell MC. The ON state of the selected memory cell MC is also maintained by maintaining the first voltage after the selected memory cell MC is placed into an ON state.

The semiconductor memory device 1 performs a first readout operation (1st READ) on the selected memory cell MC as described above. By the first readout operation, the preamplifier 121 stores therein the resistance state of the memory cell MC to be read out as voltage information (signal voltage) V1st.

[Step S1004]

The semiconductor memory device 1 performs first write (for example, the operation of writing "0" (WRITE "0")) of writing first data into the memory cell. MC on which the first readout operation is performed. As a result, the first data (for example, "0" data) is overwritten on the memory cell MC on which the first readout operation is performed. The operation causes the memory cell MC to be in a reference state ("0" here) in order to generate V2nd described below.

[Step S1005]

The semiconductor memory device 1 performs a second readout operation (2nd READ) on the memory cell MC on which the first readout operation is performed. The preamplifier 121 generates voltage information (signal voltage) V2nd by the second readout operation.

[Step S1006]

The sense amplifier unit 120 determines the result of V1st generated by Step S1003 on the basis of V2nd generated by Step S1005. Specifically, the sense amplifier unit 120 determines the data stored in the memory cell MC by comparing the current obtained by adding a reference current Ishift1 and a current I1st based on V1st together, and a current I2nd based on V2ndb with each other.

<1-2-2> Specific Example of Readout Operation

Figure 16:
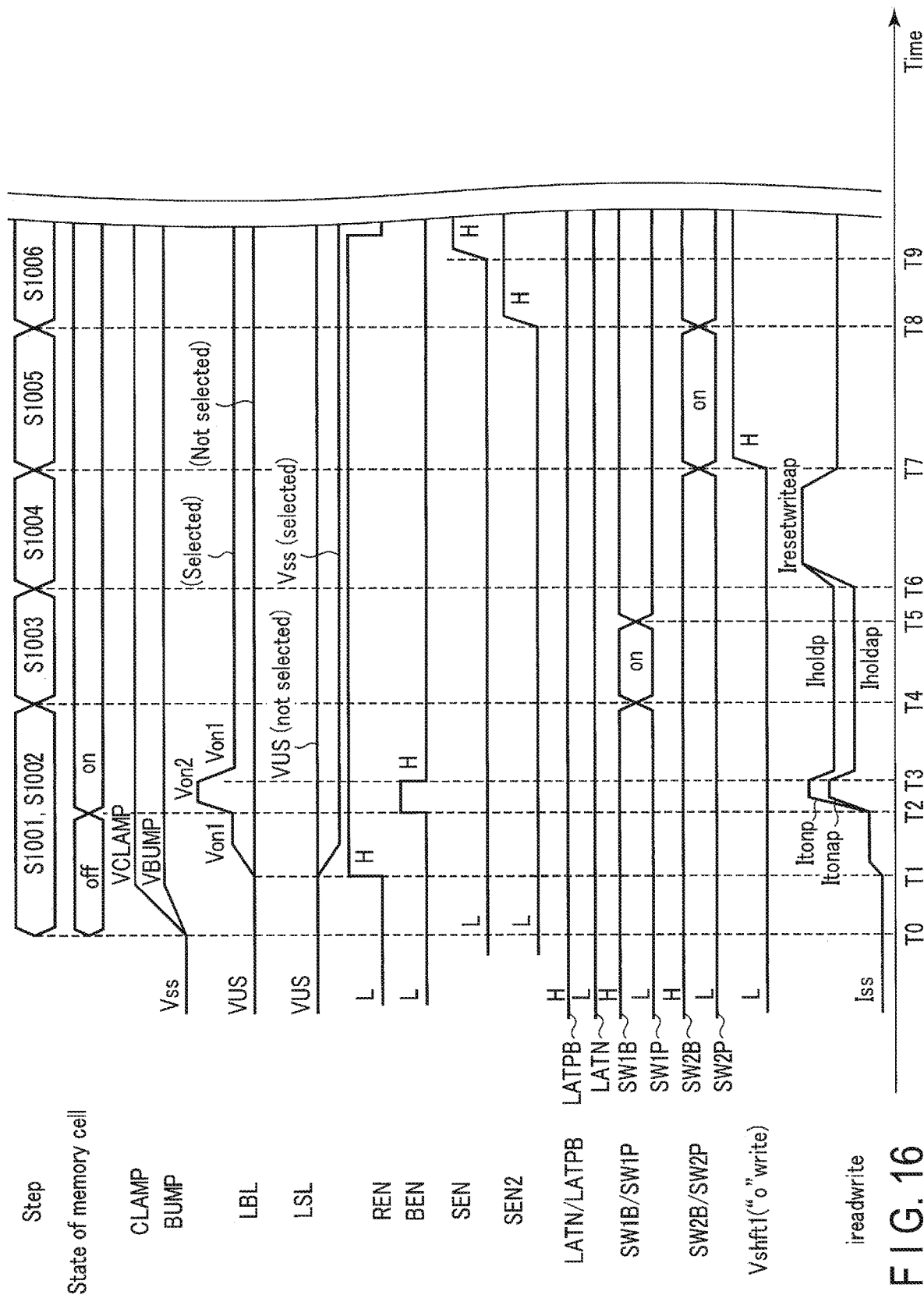
FIG. 16 is a specific waveform diagram of the readout operation of the semiconductor memory device according to the first embodiment.

A specific example of the readout operation of the semiconductor memory device according to the first embodiment is described along a waveform diagram of FIG. 16. FIG. 16 illustrates a time relationship between the steps illustrated in FIG. 14, the state of the selected memory cell, the voltages of the signal CLAMP, the signal BUMP, the local bit line LBL, the local source line LSL, the signal REN, the signal BEN, the signal SEN, the signal SEN2, the signal LATN, the signal LATPB, the signal SW1B, the signal SW1P, the signal SW2B, the signal SW2P, and the signal Vshft1, and the current value of a current ireadwrite flowing through the selected memory cell.

[Time T0] to [Time T2]

At time T0, the controller 15 steps up the signal CLAMP from the voltage Vss to a voltage VCLAMP in the ON operation (Step S1001). The controller 15 steps up the signal BUMP from the voltage Vss to the voltage VBUMP.

At time T0, the controller 15 sets the electric potentials of the signal REN, the signal BEN, the signal SEN, the signal SEN2, the signal LATN, the signal SW1P, the signal SW2P, and the signal Vshft1 to an "L" level, and sets the electric potentials of the signal LATPB, the signal SW1B, and the signal SW2B to an "H" level. The electric potentials of the local bit line LBL and the local source line LSL become VUS, and the current ireadwrite becomes Iss.

At time T1, the controller 15 sets the signal REN to an "H (High)" level in the ON operation (Step S1001). The controller 15 maintains the non-selected local source line LSL at a voltage VUS, and steps down the selected local source line LSL to the voltage Vss (Vss<VUS).

Figure 17:
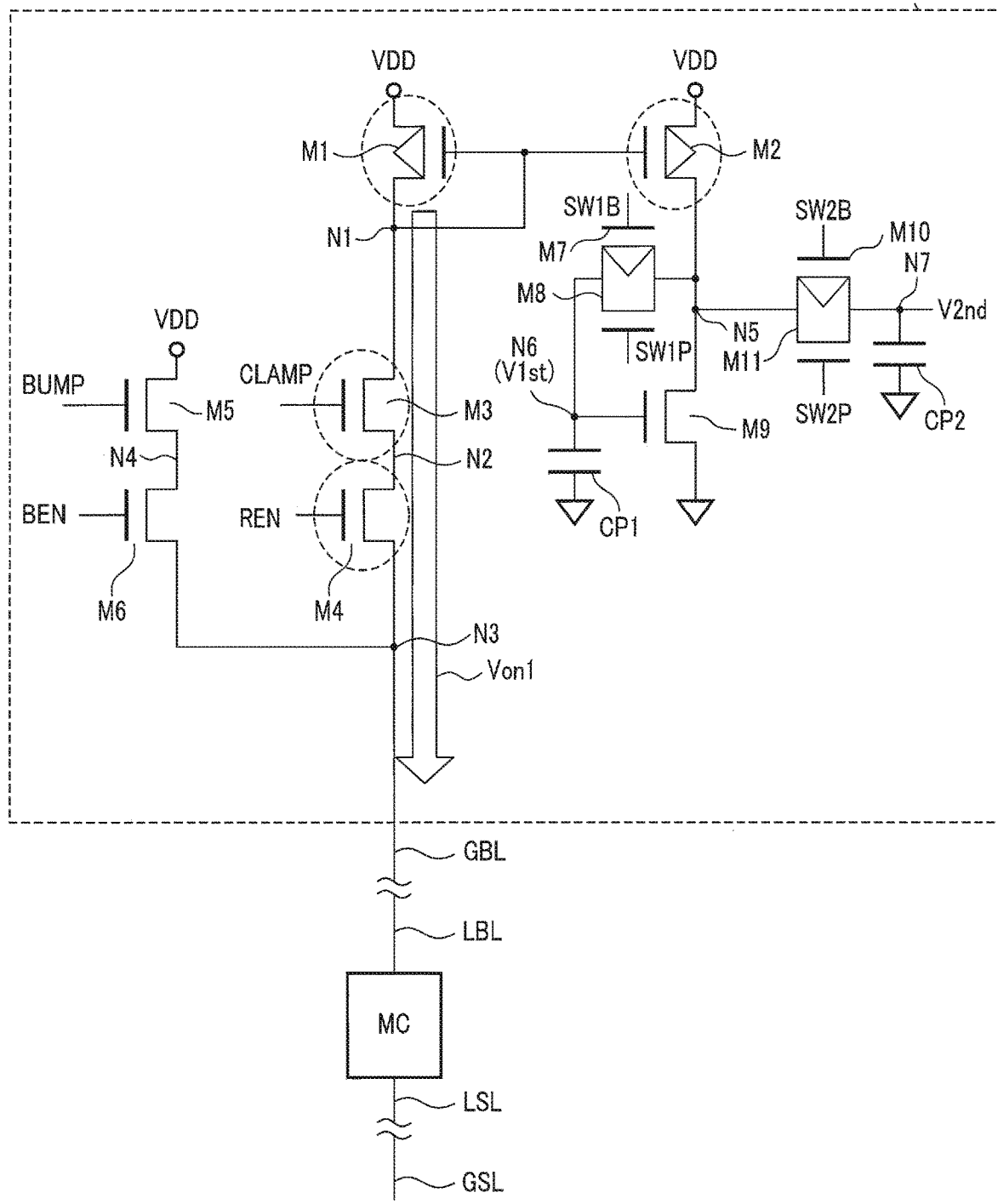
FIG. 17 is a circuit diagram illustrating the preamplifier in the readout operation of the semiconductor memory device according to the first embodiment.

As a result, as illustrated in FIG. 17, the transistors M3 and M4 are placed into an ON state. As a result, the node N1 is grounded via the node N2, the node N3, the global bit line, the local bit line, the memory cell MC, the local source line, and the global source line. As a result, the electric potential of the node N1 decreases, and the transistors M1 and M2 are placed into an ON state.

When the transistors M1, M3, and M4 are placed into an ON state, the transistors M1, M3, and M4 supply a voltage Von1 to the memory cell MC.

As a result, the voltage Von1 in accordance with the voltage VCLAMP is applied to the selected memory cell MC. However, the voltage does not exceed the voltage Vsel, and hence the selected memory cell MC is maintained in an OFF state.

[Time T2] to [Time T4]

Returning to FIG. 16, time T2 to time T4 are described.

At time T2, the controller 15 sets the signal BEN to an "H" level in the ON operation (Step S1002).

Figure 18:
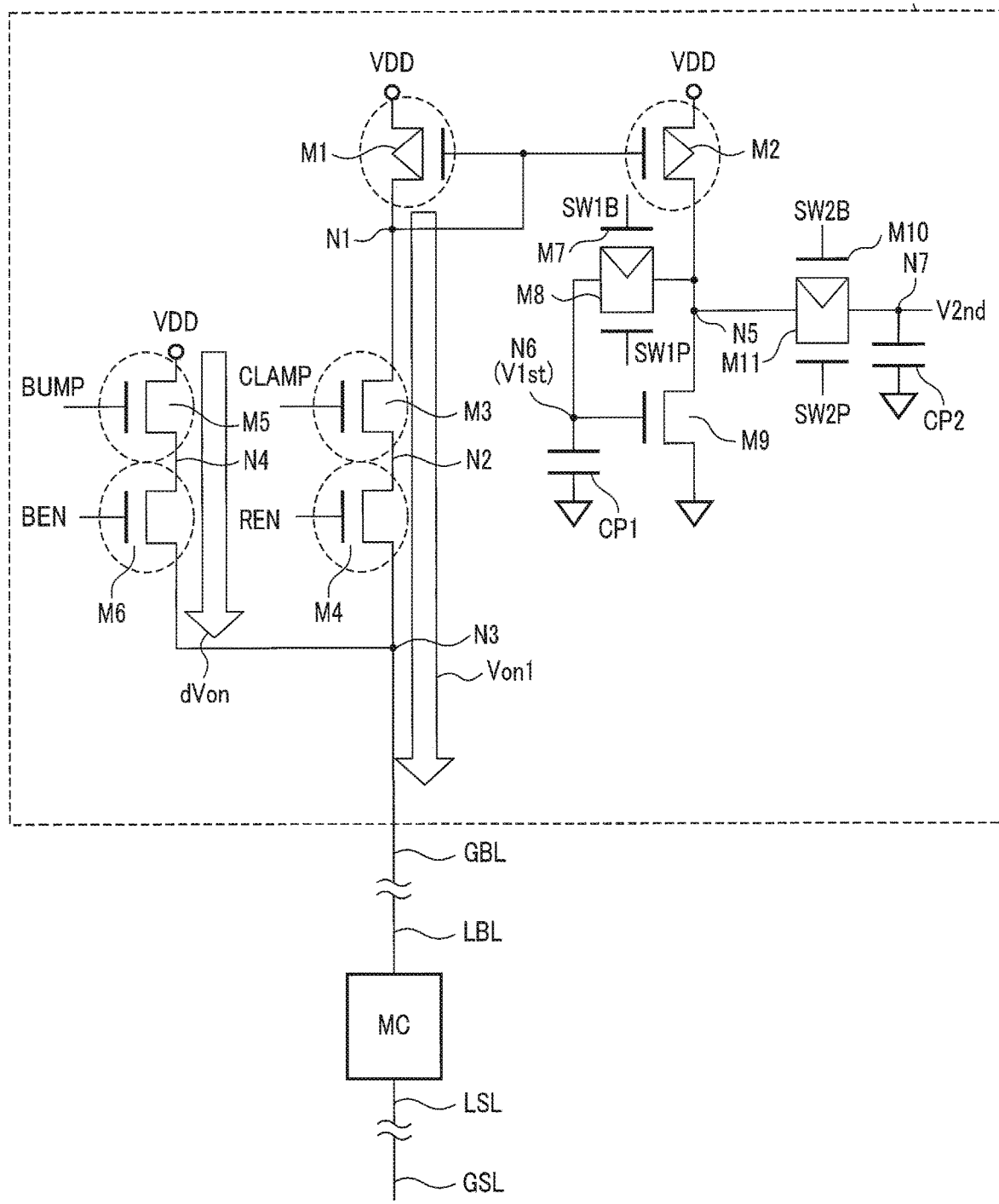
FIG. 18 is a circuit diagram illustrating the preamplifier in the readout operation of the semiconductor memory device according to the first embodiment.

As a result, as illustrated in FIG. 18, the transistors M5 and M6 are both placed into an ON state. As a result, a voltage Von2 (Von1<Von2) is supplied to the memory cell MC.

As a result, the voltage Von2 that is higher than the voltage Von1 is applied to the selected memory cell MC, and the selected memory cell MC is placed into an ON state. Note that the voltage Vss is applied to the non-selected memory cells MC and the second half-selected memory cells MC, and hence the non-selected memory cells MC and the second half-selected memory cells MC are maintained in an OFF state. A voltage obtained by subtracting the voltage of the non-selected local source line LSL from the voltage of the selected local bit line LBL is applied to the first half-selected memory cells MC. In other words, a voltage (Von2−VUS) is applied to the first half-selected memory cells MC. The voltage VUS needs to be set so that the voltage (Von2−VUS) does not exceed the voltage Vsel. As a result, the first half-selected memory cells MC are maintained in an OFF state.

Note that, at this time, the current ireadwrite flowing through the selected memory cell is Itonp when the selected memory cell is in a P state, and is Itonap (Itonap<Itonp) when the selected memory cell is in an AP state.

Returning to FIG. 16, the continuation of the operation waveform is described.

At time T3, the controller 15 sets the signal BEN to an "L" level in the ON operation (Step S1002). As a result, the voltage Von2 is not supplied to the selected memory cell MC, but the ON state is maintained because the voltage Von1 that exceeds the voltage Vhold is applied to the selected memory cell MC.

Note that the amount of time from time T2 to time T3 is shorter than the amount of time defined by another time and another time. The amount of time from time T2 and time T3 is a length that does not disturb the readout of the memory cell MC.

[Time T4] to [Time T6]

The controller 15 sets the signal SW1P to an "H" level and sets the signal SW1B to the "L(Low)" (L<H) level in the first readout operation (Step S1003).

As a result, as illustrated in FIG. 19, the transistors M7 and M8 are placed into an ON state.

The transistor M1 is in an ON state, and supplies a cell current (Icell_1st) to the memory cell MC.

The transistor M2 is driven on the basis of the electric potential of the node N1 as with the transistor M1. Therefore, a copy current (Icopy_1st) of the cell current (Icell_1st) is supplied to the node N5.

As described above, the transistors M1 and M2 form a current mirror.

Then, the electric potential of the node N6 becomes the voltage information (signal voltage) V1st based on the copy current (icopy_1st).

Returning to FIG. 16, the continuation of the operation waveform is described. At time T5, the controller 15 causes the signal REN and the signal SW1P to fall to an "L" level, and raises the signal SW1B to an "H" level. Therefore, the transistors M7 and M8 are placed into an OFF state. As a result, V1st is stored in the node N6.

[Time T6] to [Time T7]

Returning to FIG. 16, the continuation of the operation waveform is described. The controller 15 applies a "0" data write current (a write current Irestwritep that is higher than Iholdp) in the same direction as that of the readout in the operation of writing "0" (Step S1004).

As a result, the "0" data is written into the selected memory cell MC by the writing circuit 113.

[Time T7] to [Time T8]

The controller 15 sets the signal REN and the signal SW2P to an "H" level and sets the signal SW2B to an "L" level in the second readout operation (Step S1005).

As a result, as illustrated in FIG. 20, the transistors M1, M2, M3, M4, M10, and M11 are placed into an ON state. The transistor M9 is placed into an ON state on the basis of V1st.

The transistors M1, M3, and M4 supply a cell current (Icell_2nd) to the memory cell MC that stores the "0" data therein.

The transistor M2 is driven on the basis of the electric potential of the node N1. Therefore, a copy current (Icopy_2nd) of the cell current (Icell_2nd) is supplied to the node N5.

The transistor M9 supplies the cell current (Icell_1st) to the node N5 as a constant current transistor based on the voltage of V1st.

Then, the electric potentials of the nodes N5 and N7 become amplified operating point voltage information (signal voltage) V2nd based on the first readout copy current (Icopy_1st) and the second readout copy current (Icopy_2nd).

[Time T8] Onward

Returning to FIG. 16, the continuation of the operation waveform is described. The controller 15 causes the signal REN, the signal SW2P, and the signal SEN to fall to an "L" level and raises the signal SW2B, the signal SEN2, and the signal Vshft1 to an "H" level in a determination operation (Step S1006). The controller 15 sets the signal LATPB to an "H" level and sets the signal LATN to an "L" level.

As a result, the transistors M10 and M11 are placed into an OFF state. As a result, the node N7 stores the voltage information (signal voltage) V2nd therein.

As illustrated in FIG. 21, the transistors M13 to M19, M21, M22, M24, M25, and M26 of the amplifier 1221 are placed into an ON state. The transistor M27 is placed into an OFF state.

As a result, the transistor M24 causes the current list corresponding to the signal V1st to flow. The transistor M25 causes a shift current Ishift1 corresponding to the signal Vshft1 to flow. The transistor M26 causes the current I2nd corresponding to the signal V2nd to flow.

At time T9, the controller 15 sets the signal SEN to an "H" level, thereby placing the transistors M16 and M17 into an OFF state and cutting off the current supply from the transistors M16 and M17. As a result, the electric potential of the node N9 is determined on the basis of the current I1st and the shift current Ishift1. The electric potential of the node N10 is determined on the basis of the current I2nd. As a result, a voltage difference increases between the node N9 and the node N10, and the voltage difference instantly increases by the positive feedback of the transistors M13, M14, M18, and M21.

Therefore, the amplifier 1221 defines the signal DO and the signal DOB. Then, the signal DO and the signal DOB are compared with each other by the comparison unit 1222.

<1-3> Effect

According to the embodiment described above, the pre-amplifier 121 includes the transistors M5 and M6 that function as a booster for placing the selector of the selected memory cell MC into an ON state. With use of the transistors M5 and M6, the selector of the selected memory cell MC is placed into an ON state before the first readout operation.

Incidentally, when the readout operation is performed at a voltage that provides the voltage Vsel by which the selector is placed into an ON state, the readout current increases, thereby causing a fear of disturbance.

Thus, in order to reduce the read disturbance, the transistor M6 is placed into an ON state for an extremely short amount of time (time T2 to time T3 in FIG. 16). Then, the first readout operation is performed.

As a result, in the semiconductor memory device in which the selector is employed in the memory cell MC, the readout operation can be suitably performed.

<1-4> Modified Example

Note that, in the description above, the readout in the direction of writing data 0 into the selected memory cell MC is described in Step S1001 to Step S1006, but the first and second readout directions and the first write direction may be directions of writing data 1 so that the readout is performed in the direction of writing data 1 into the selected memory cell MC.

Figure 22:
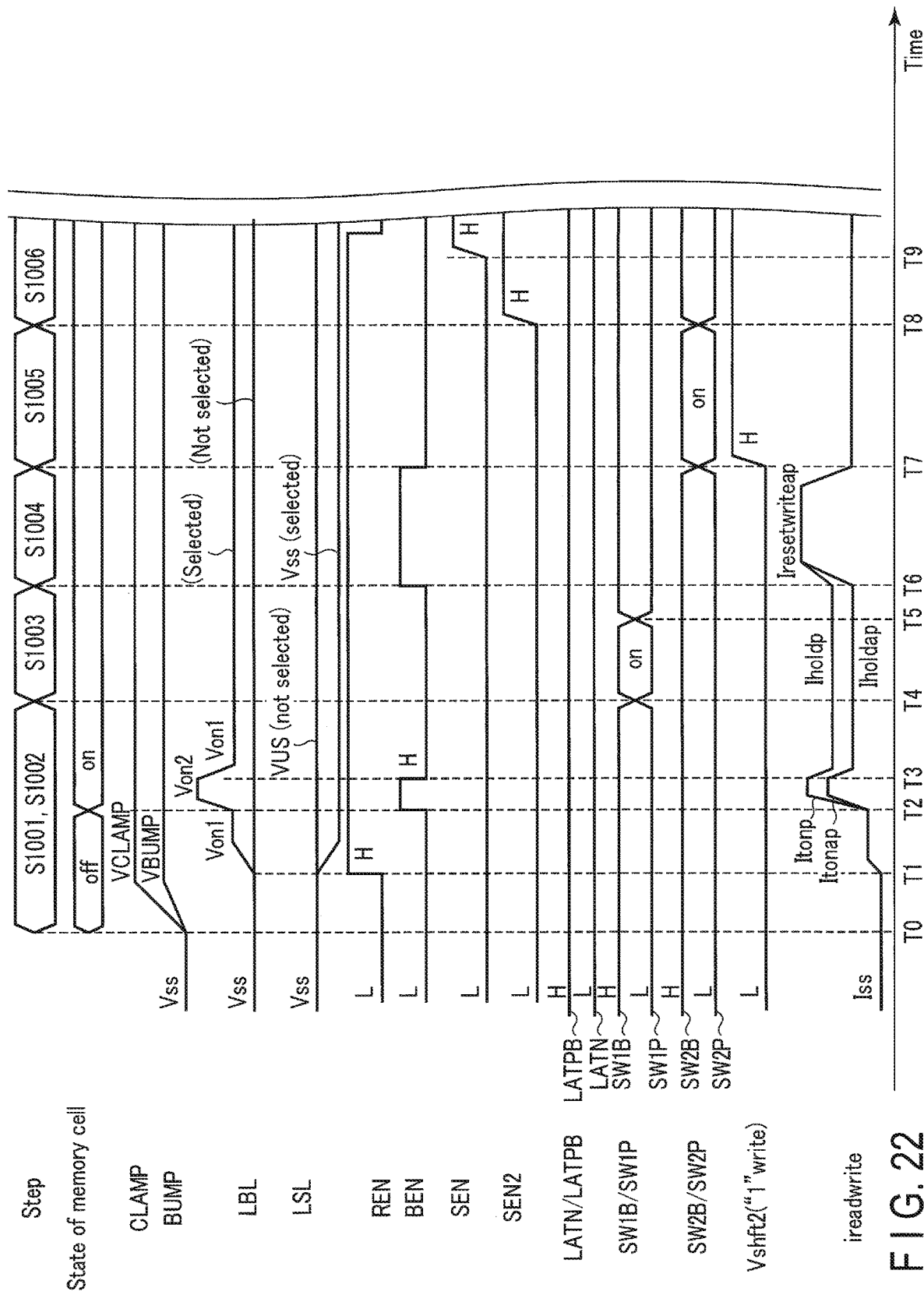
FIG. 22 is a specific waveform diagram of a readout operation of a semiconductor memory device according to a modified example of the first embodiment.

Thus, with reference to FIG. 22, an operation according to a comparative example is described. FIG. 22 illustrates a time relationship between the steps illustrated in FIG. 14, the state of the memory cell, the voltages of a signal CLAMP, a signal BUMP, a local bit line LBL, a local source line LSL, a signal REN, a signal BEN, a signal. SEN, a signal SEN2, a signal LATN, a signal LATPB, a signal SW1B, a signal SW1P, a signal SW2B, a signal SW2P, and a signal Vshft2, and the current value of a current ireadwrite flowing through a selected memory cell.

Note that the operation illustrated in FIG. 22 is basically similar to the operation illustrated in FIG. 16. Therefore, the parts that are different from those of FIG. 16 are described below.

First, as indicated by time T6 in FIG. 22, by raising the signal BEN from an "L" level to an "H" level by a controller 15, a preamplifier 121 may supply a write current Irstwriteap to the selected memory cell.

Specifically, as illustrated in FIG. 22, from time T8, the controller 15 causes the signal REN, the signal SW2P, and the signal SEN to fall to an "L" level, and raises the signal SW2B, the signal SEN2, and the signal Vshft2 to an "H" level in a determination operation (Step S1006). The controller 15 sets the signal LATPB to an "H" level and sets the signal LATN to an "L" level.

Figure 23:
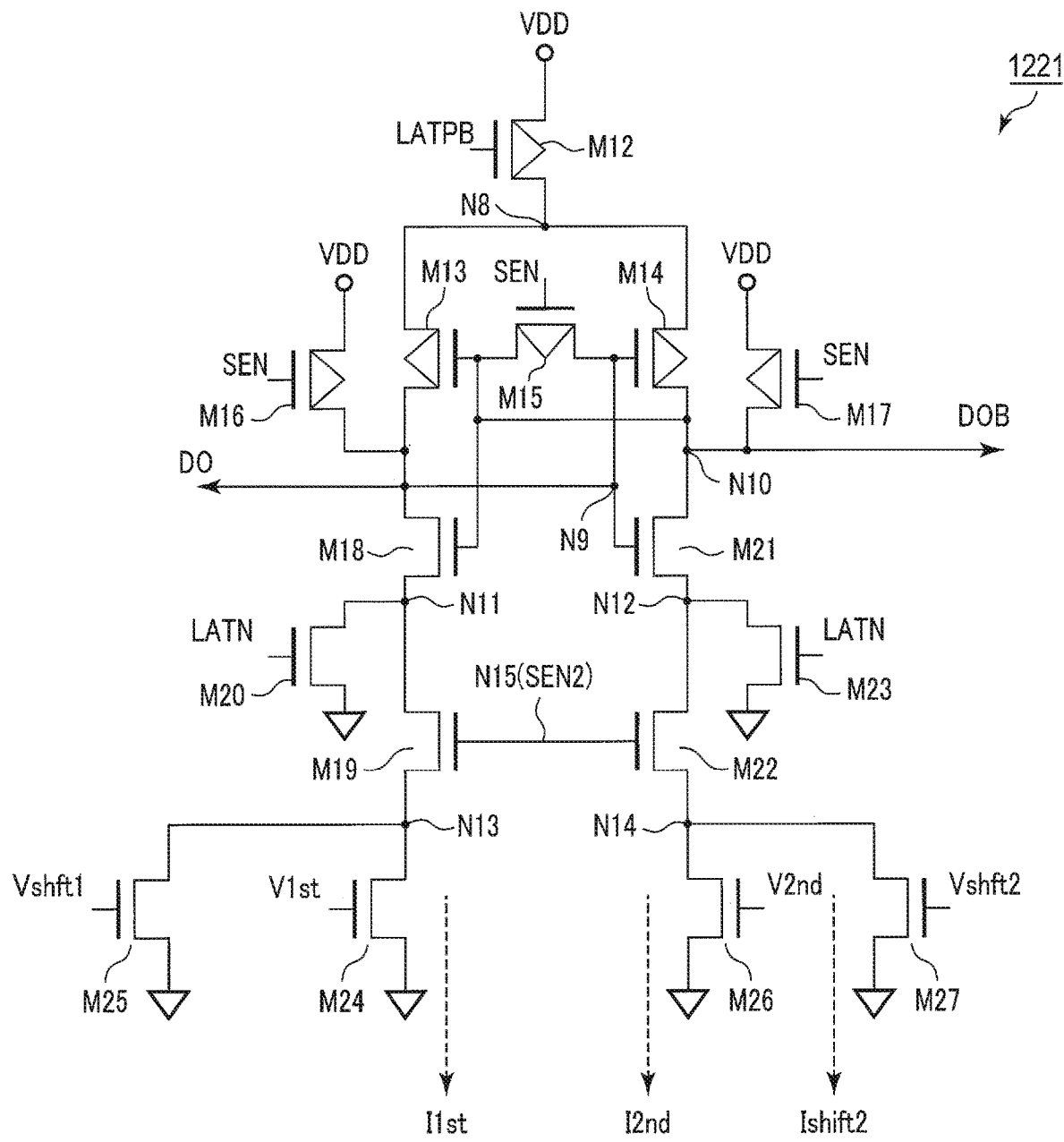
FIG. 23 is a circuit diagram illustrating an amplifier in the readout operation of the semiconductor memory device according to the modified example of the first embodiment.

As illustrated in FIG. 23, transistors M13 to M19, M21, M22, M24, M26, and M27 of the amplifier 1221 are placed into an ON state. A transistor M25 is placed into an OFF state.

As a result, the transistor M24 causes a current I1st corresponding to a signal V1st to flow. The transistor M26 causes a current I2nd corresponding to a signal V2nd to flow. The transistor M27 causes a shift current Ishift2 corresponding to the signal Vshft2 to flow.

At time T9, the controller 15 sets the signal SEN to an "H" level, thereby placing the transistors M16 and M17 into an OFF state and cutting off the current supply from the transistors M16 and M17. As a result, the electric potential of a node N9 is determined on the basis of the current I1st. The electric potential of a node N10 is determined on the basis of the current I2nd and the shift current Ishift2. As a result, a voltage difference increases between the node N9 and the node N10, and the voltage difference instantly increases by the positive feedback of the transistors M13, M14, M18, and M21.

As a result, the amplifier 1221 defines the signal DO and the signal DOB. Then, the comparison unit 1222 compares the signal DO and the signal DOB with each other.

As described above, even when data 1 is written into the selected memory cell MC in Step S1004, an effect similar to that of the first embodiment can be obtained.

<2> Second Embodiment

A second embodiment is described. In the second embodiment, a case where the voltage is gradually applied in order to place a selected memory cell into an ON state is described. Note that the basic configuration and the basic operation of a device according to the second embodiment is similar to the device according to the above-mentioned embodiment. Therefore, the description of the features described in the above-mentioned embodiment and the features that can be easily known by analogy from the above-mentioned embodiment is omitted.

<2-1> Operation

<2-1-1> Outline of Readout Operation

Figure 24:
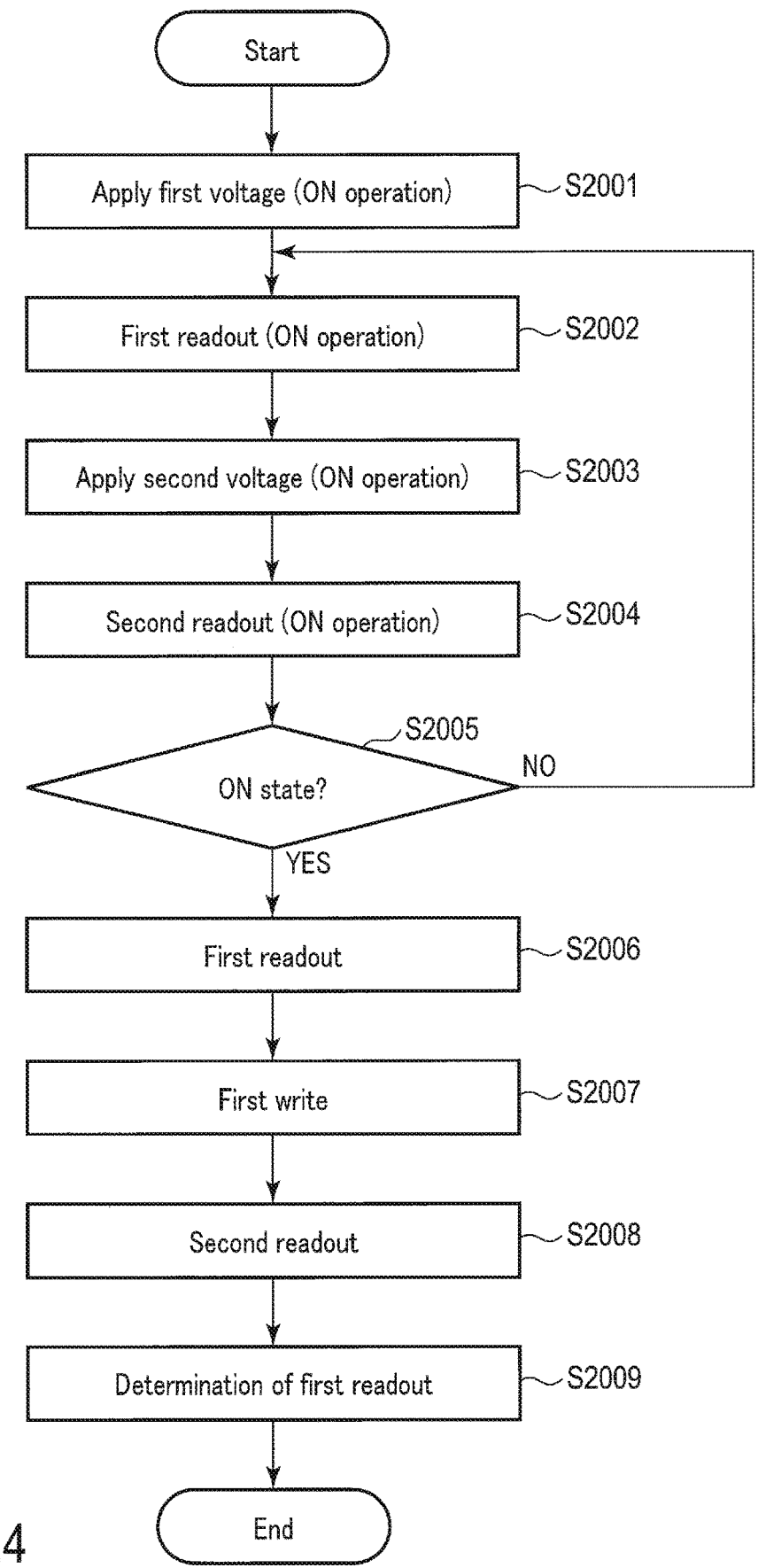
FIG. 24 is a flowchart for describing a readout operation of a semiconductor memory device according to a second embodiment.
Figure 25:
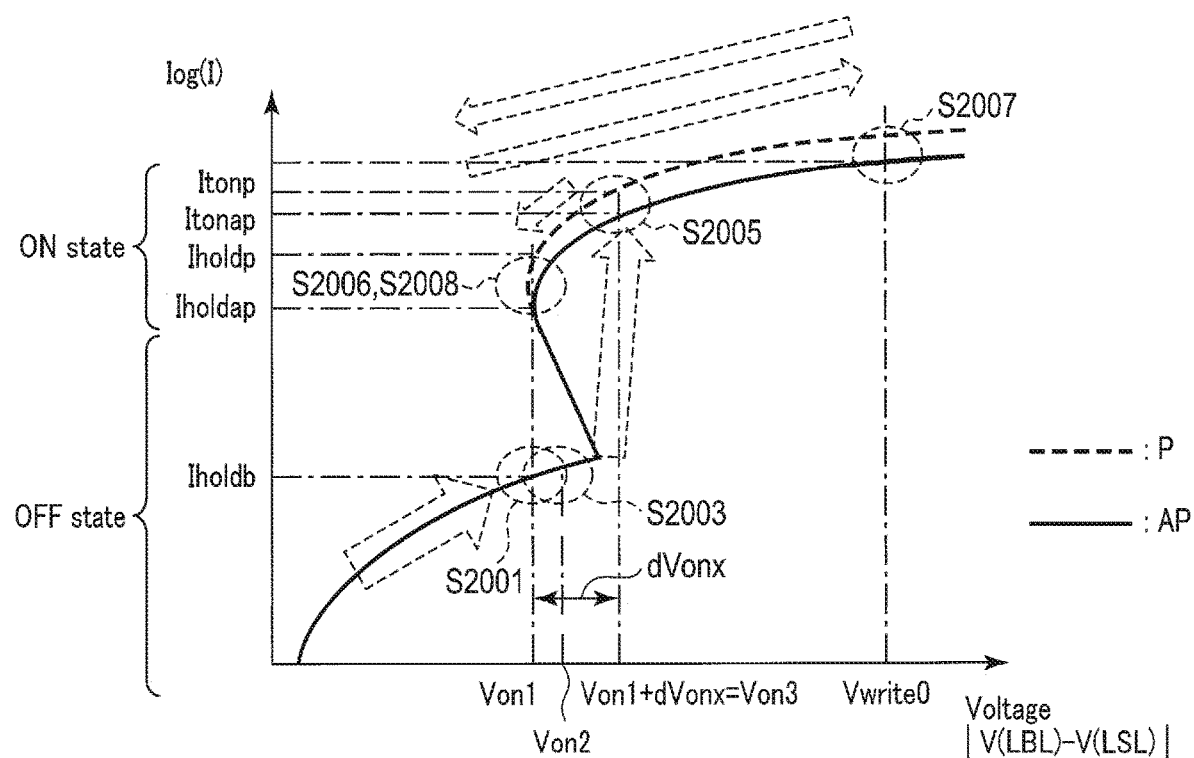
FIG. 25 is a graph showing current-voltage characteristics of a memory cell for describing the readout operation of the semiconductor memory device according to the second embodiment.

With reference to FIG. 24 and FIG. 25, an outline of a readout operation of a semiconductor memory device according to the second embodiment is described.

[Step S2001]
When a memory controller 2 receives a readout order (host command) from a host 3, the memory controller 2 issues an active command and a readout command to a semiconductor memory device 1.

When the semiconductor memory device 1 receives the active command and the readout command from the memory controller 2, the semiconductor memory device 1 performs an operation (ON operation) for placing a selected memory cell MC to be read out into an ON state. Specifically, the controller 15 applies a first voltage to the selected memory cell MC. As a result, as shown in FIG. 25, a cell current becomes a current Iholdb (OFF state).

[Step S2002]
The semiconductor memory device 1 performs a first readout operation in a state in which Step S2001 has been performed. By the first readout operation, a preamplifier 121 stores therein a resistance state of the memory cell MC to be read out as voltage information (signal voltage) V1st.

[Step S2003]
The semiconductor memory device 1 applies a second voltage that is higher than the first voltage to the selected memory cell MC as an operation (ON operation) for placing the selected memory cell MC into an ON state.

Note that the second voltage is applied for an extremely short amount of time (an amount of time that is shorter than other steps).

[Step S2004]
The semiconductor memory device 1 performs a second readout operation on the memory cell MC on which the first readout operation is performed. The preamplifier 121 generates voltage information (signal voltage) V2nd by the second readout operation.

[Step S2005]
A sense amplifier unit 120 determines the magnitudes of a voltage V1st generated by Step S2002 and a voltage V2nd generated by Step S2004. Specifically, the sense amplifier unit 120 can determine whether the selected memory cell MC is in an ON state by comparing a current obtained by adding a reference current Ishift1 and a current. I1st based on the voltage V1st together, and a current I2nd based on the voltage V2nd with each other.

The semiconductor memory device 1 can determine that the selected memory cell MC is in an ON state when the current I2nd exceeds (the current I1st)+(the reference current Ishift1) by generating the reference current Ishift1 so that (the current I1st)+(the reference current Ishift1) is less than the current Iholdap.

When the current I2nd does not exceed (the current I1st)+(the reference current Ishift1), the semiconductor memory device 1 determines that the selected memory cell is in an OFF state, and repeats Step S2002.

When the current I2nd exceeds (the current I1st)+(the reference current Ishift1), the semiconductor memory device 1 determines that the selected memory cell is in an ON state, and proceeds to Step S2006.

[Step S2006] to [Step S2009]
Step S2006 to Step S2009 are the same as Step S1003 to Step S1006 in FIG. 14.

<2-1-2> Specific Example of Readout Operation

Figure 26:
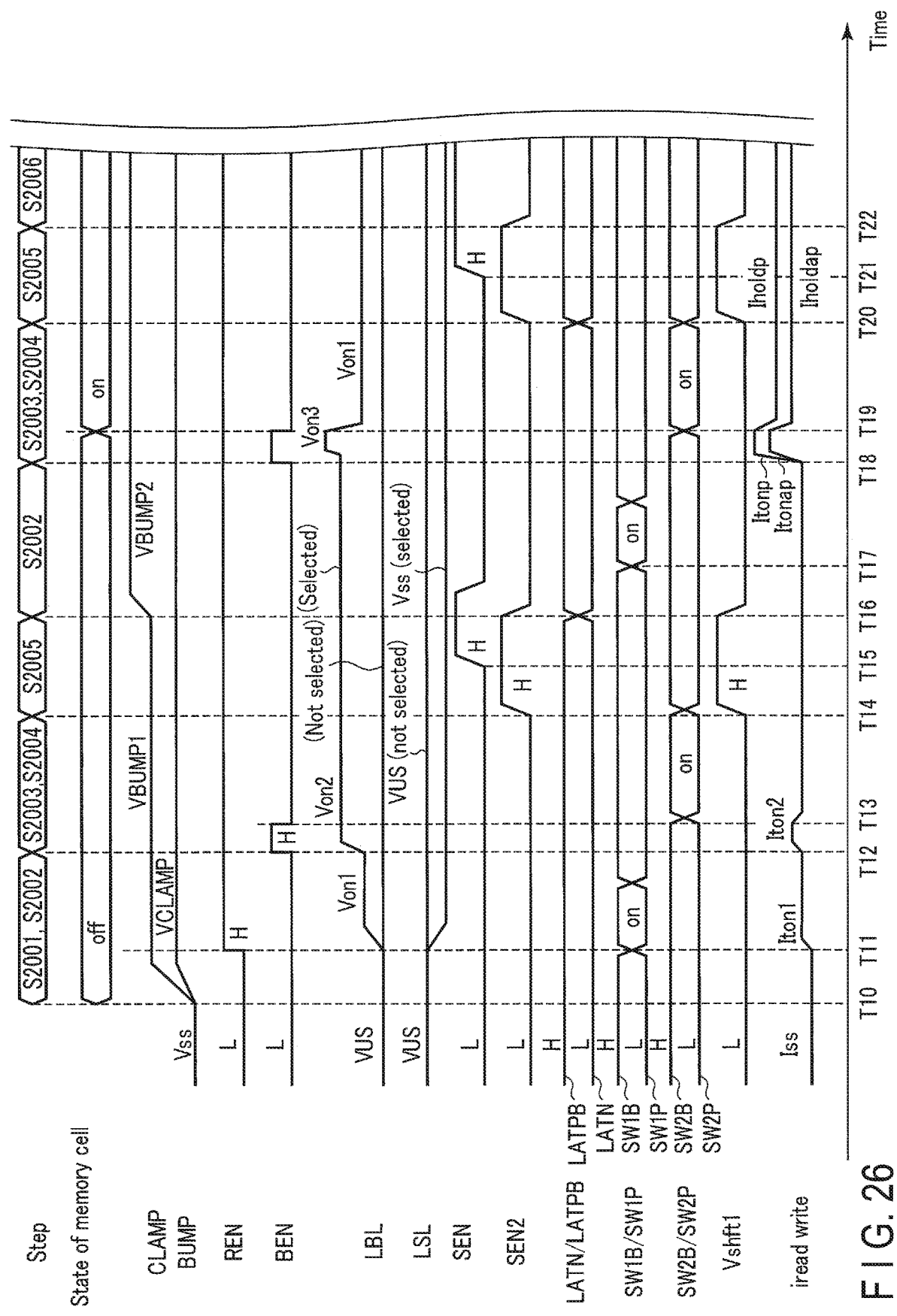
FIG. 26 is a specific waveform diagram of the readout operation of the semiconductor memory device according to the second embodiment.

A specific example of a readout operation of the semiconductor memory device according to the second embodiment is described along a waveform diagram of FIG. 26. FIG. 26 illustrates a time relationship between the steps illustrated in FIG. 24, the state of the memory cell, the voltages of a signal CLAMP, a signal BUMP, a local bit line LBL, a local source line LSL, a signal REN, a signal BEN, a signal SEN, a signal SEN2, a signal LATN, a signal LATPB, a signal SW1B, a signal SW1P, a signal SW2B, a signal SW2P, and a signal Vshft1, and the current value of a current ireadwrite flowing through the selected memory cell.

[Time T10] to [Time T12]

At time T10, the controller 15 steps up the signal CLAMP from a voltage Vss to a voltage VCLAMP in the ON operation (Step S2001). The controller 15 steps up the signal BUMP from the voltage Vss to a voltage VBUMP1.

At time T10, the controller 15 sets the electric potentials of the signal REN, the signal BEN, the signal SEN, the signal SEN2, the signal LATN, the signal SW1P, the signal SW2P, and the signal Vshft1 to an "L" level, and sets the electric potentials of the signal LATPB, the signal SW1B, and the signal SW2B to an "H" level. The electric potentials of the local bit line LBL and the local source line LSL become VUS, and the current ireadwrite becomes Iss.

At time T11, the controller 15 sets the signal REN to an "H" level in the ON operation (Step S2001). The controller 15 maintains the non-selected local source line LSL at a voltage VUS and steps down the selected local source line LSL to the voltage Vss.

As a result, a voltage Von1 is applied to the selected memory cell MC. However, a voltage Vsel is not exceeded, and hence the selected memory cell MC is maintained in an OFF state.

[Time T12] to [Time T14]

At time T12, the controller 15 sets the signal BEN to an "H" level in the ON operation (Step S2002).

As a result, a voltage Von2 that is higher than the voltage Von1 is applied to the selected memory cell MC.

At time T13, the controller 15 sets the signal BEN to an "L" level in the ON operation (Step S2002).

Note that the amount of time from time T12 to time T13 is shorter than the amount of time defined by another time and another time. The amount of time from time T12 to time T13 is a length that does not disturb the readout of the memory cell MC.

[Time T14] to [Time T16]

The controller 15 causes the signal REN, the signal SW2P, and the signal SEN to fall to an "L" level, and raises the signal SW2B, the signal SEN2, and the signal Vshft1 to an "H" level in a determination operation (Step S2005). The controller 15 causes the signal LATPB to be an "H" level and causes the signal LATN to be an "L" level.

At time T15, by setting the signal SEN to an "H" level by the controller 15, the amplifier 1221 defines the signal DO and the signal DOB. Then, the comparison unit 1222 compares the signal DO and the signal DOB with each other.

The semiconductor memory device 1 determines whether the selected memory cell MC is in an ON state by the comparison. In this example, the selected memory cell MC is not in the ON state, and hence Step S2002 is repeated.

[Time T16] to [Time T22]

An operation from time T16 to time T22 is similar to the operation of time T10 to T16 other than the electric potential of the local bit line LBL generated by the signal control of the signal BUMP. In the example of FIG. 26, the controller 15 sets the signal BUMP to be a voltage VBUMP2 (VBUMP1<VBUMP2) and sets the signal BEN to an "H" level at time T18, thereby causing the electric potential of the local bit line LBL to be Von3 (Von2<Von3).

However, here, the selected memory cell MC is in an ON state at time T19, and hence the semiconductor memory device 1 determines that the selected memory cell MC is "in an ON state" during time T20 to time T22.

[Time T22] Onward

Then, from time T22, the semiconductor memory device 1 performs an operation similar to that from time T4 described in FIG. 16.

<2-2> Effect

According to the embodiment described above, in the operation of placing the selected memory cell MC into an ON state, the voltage applied to the selected memory cell MC is gradually stepped up, and it is determined whether the selected memory cell MC is in an ON state with use of the sense amplifier.

In the first embodiment, in the ON operation, the second voltage is controlled so as to be a voltage that always exceeds VSEL of the selected memory cell MC. However, in the second embodiment, a voltage that exceeds VSEL of the selected memory cell MC is generated by gradually stepping up the voltage. Therefore, there is no need to apply an unnecessarily high voltage to the selected memory cell MC. As a result, as compared to the first embodiment, the read disturbance can be further suppressed.

<3> Third Embodiment

A third embodiment is described. In the first and second embodiments described above, a constant-voltage-type preamplifier is described. However, in the third embodiment, a case where a constant-current-type preamplifier is employed is described. Note that the basic configuration and the basic operation of a device according to the third embodiment are similar to those according to the above-mentioned embodiments. Therefore, the description of the features described in the above-mentioned embodiments and the features that can be easily known by analogy from the above-mentioned embodiments is omitted.

<3-1> Configuration

<3-1-1> Readout Circuit

Figure 27:
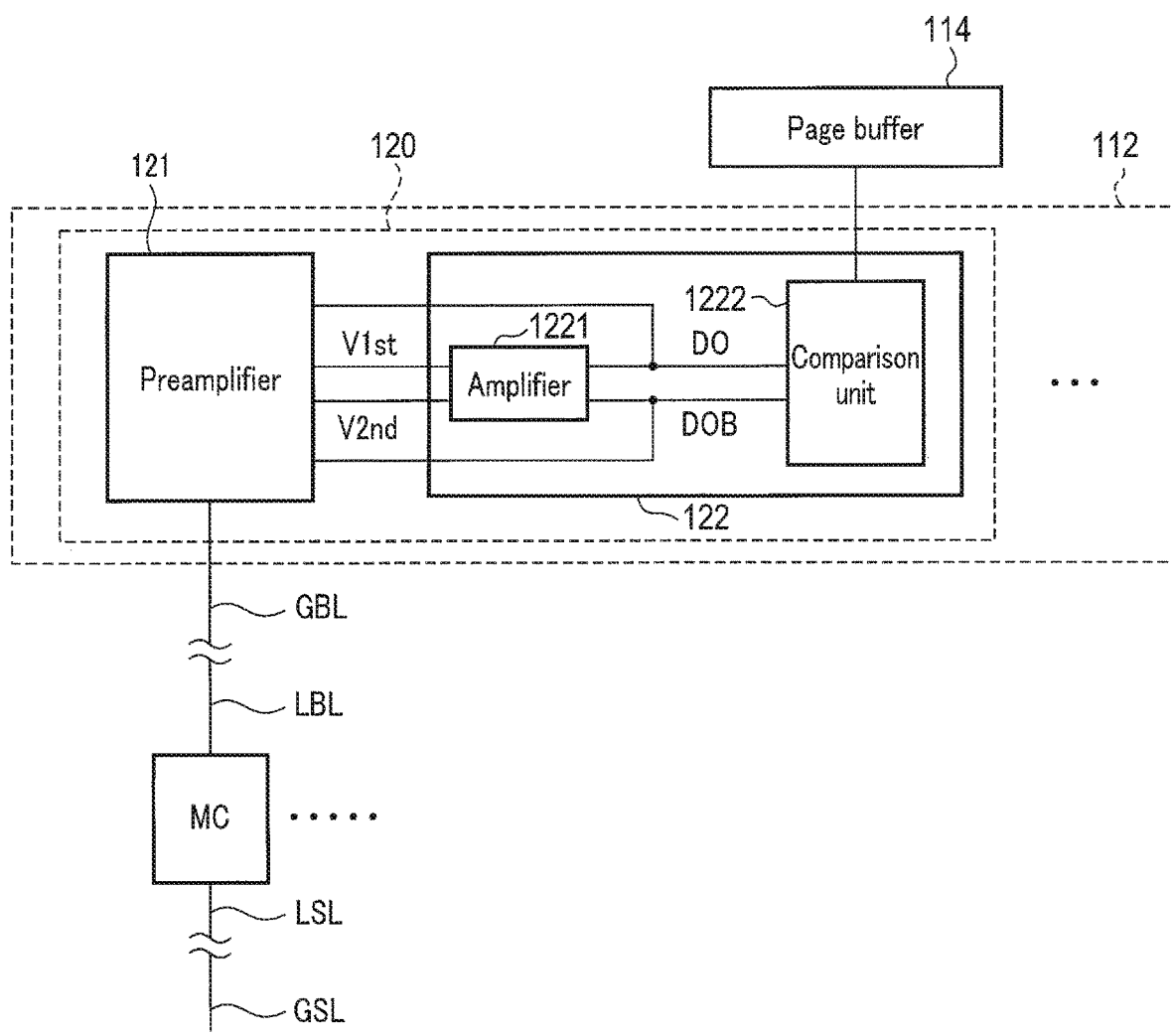
FIG. 27 is a block diagram illustrating a basic configuration of a readout circuit of a semiconductor memory device according to a third embodiment.

With reference to FIG. 27, a readout circuit 112 of a semiconductor memory device according to the third embodiment is described.

As illustrated in FIG. 27, at the time of the ON operation of the selected memory cell described below, a preamplifier 121 supplies current or voltage to the memory cell MC via the global bit line GBL and generates a voltage V3rd and a voltage V4th.

After the selected memory cell MC is placed into an ON state, the preamplifier 121 supplies current or voltage to the memory cell MC via the global bit line GBL, and generates a voltage V1st and a voltage V2nd.

The amplifier 1221 amplifies the voltage difference between the voltage V1st and the voltage V2nd generated by the preamplifier 121. Then, the amplifier 1221 generates a signal DO and a signal DOB as the amplification result.

The comparison unit 1222 compares the voltage difference between the voltage V3rd and the voltage V4th generated by the preamplifier 121 or the voltage difference between the signal DO and the signal DOB generated by the amplifier 1221, and outputs the comparison result to a page buffer 114 as data stored in the memory cell MC.

<3-1-2> Configuration of Preamplifier

Next, with reference to FIG. 27, a configuration of the preamplifier 121 of the semiconductor memory device according to the third embodiment is described. Note that the preamplifier 121 described in the third embodiment is a type of preamplifier that is referred to as a "constant current type", and is a circuit that applies a constant voltage to the memory cell MC and takes out a signal (current) in accordance with the voltage.

As illustrated in FIG. 28, the preamplifier 121 includes PMOS transistors M28, M29, M30, M31, M32, M34, M36, and M38, and NMOS transistors M33, M35, M37, and M39.

The transistor M28 has one end to which a power supply voltage VDD is applied, the other end connected to a node N16, and a gate electrode to which a signal LOAD is supplied.

The transistor M29 has one end connected to the node N16, the other end connected to a node N17 (global bit line), and a gate electrode to which a signal RENB is supplied.

The transistor M30 has one end to which the power supply voltage VDD is applied, the other end connected to a node N18, and a gate electrode to which a signal BUMP is supplied.

The transistor M31 has one end connected to the node N18, the other end connected to the node N17 (global bit line), and a gate electrode to which a signal BENB is supplied.

The transistors M30 and M31 function as a booster for placing the selected memory cell MC into an ON state. Details are described below.

The transistor M32 has one end connected to the node N17, the other end connected to a node N19, and a gate electrode to which a signal SW1Ba is supplied.

The transistor M33 has one end connected to the node N17, the other end connected to the node N19, and a gate electrode to which a signal SW1Pa is supplied.

The transistor M32 and the transistor M33 function as a switch. As described below, the switch is a switch that is used only in a selector ON operation of the selected memory cell MC, When the transistor M32 and the transistor M33 are in an ON state, the voltage V3rd is supplied to the node N19. As described above, the electric potential of the node N17 is supplied to the comparison unit 1222 as the voltage V3rd. The transistors M32 and M33 and the node N17 can be conceived as a V3rd generating unit.

The transistor M34 has one end connected to the node N17, the other end connected to a node N20, and a gate electrode to which a signal SW1Bb is supplied.

The transistor M35 has one end connected to the node N17, the other end connected to the node N20, and a gate electrode to which a signal SW1Pb is supplied.

The transistor M34 and the transistor M35 function as a switch. As described below, the switch is a switch that is used only in a first readout operation after the selected memory cell MC is placed into an ON state. When the transistor M34 and the transistor M35 are placed into an ON state, the voltage V1st is supplied to the node N20. As described above, the electric potential of the node N17 is supplied to the amplifier 1221 as the voltage V1st. The transistors M34 and M35 and the node N17 can be conceived as a V1st generating unit.

The transistor M36 has one end connected to the node N17, the other end connected to a node N21, and a gate electrode to which a signal SW2Ba is supplied.

The transistor M37 has one end connected to the node N17, the other end connected to the node N21, and a gate electrode to which a signal SW2Pa is supplied.

The transistor M36 and the transistor M37 function as a switch. As described below, the switch is a switch that is used only in the selector ON operation of the selected memory cell MC. When the transistor M36 and the transistor M37 are placed into an ON state, a voltage V4th is supplied to the node N21. As described above, the electric potential of the node N17 is supplied to the comparison unit 1222 as the voltage V4th. The transistors M36 and M37 and the node N17 can be conceived as a V4th generating unit.

The transistor M38 has one end connected to the node N17, the other end connected to a node N22, and a gate electrode to which a signal SW2Bb is supplied.

The transistor M39 has one end connected to the node N17, the other end connected to the node N22, and a gate electrode to which a signal SW2Pb is supplied.

The transistor M38 and the transistor M39 function as a switch. As described below, the switch is a switch that is used only in a second readout operation after the selected memory cell MC is placed into an ON state. When the transistor M38 and the transistor M39 are placed into an ON state, the voltage V2nd is supplied to the node N22. As described above, the electric potential of the node N17 is supplied to the amplifier 1221 as the voltage V2nd. The transistors M38 and M39 and the node N17 can be conceived as a V2nd generating unit.

<3-2> Operation

<3-2-1> Outline of Readout Operation

Figure 29:
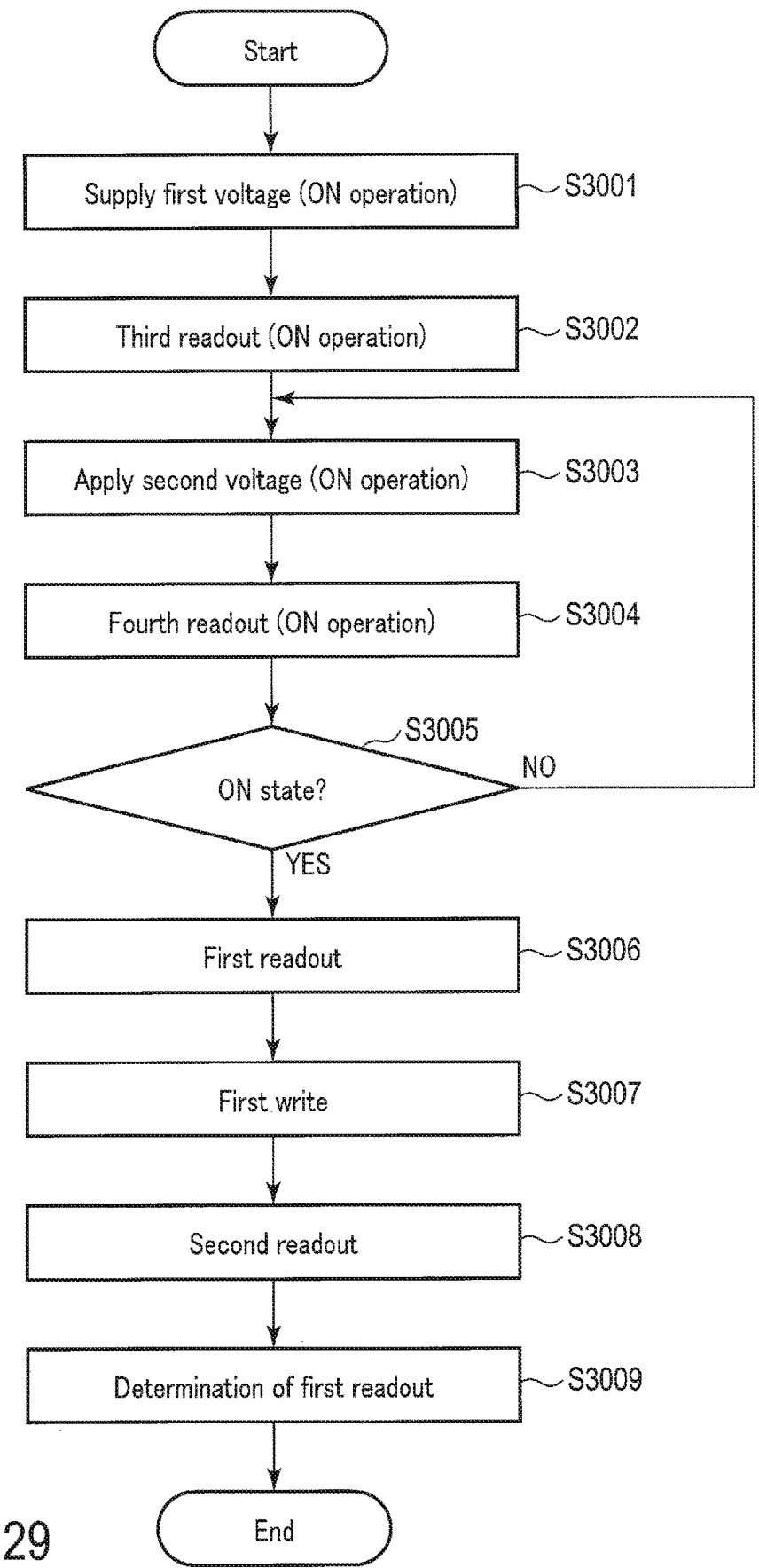
FIG. 29 is a flowchart for describing the readout operation of the semiconductor memory device according to the third embodiment.
Figure 33:
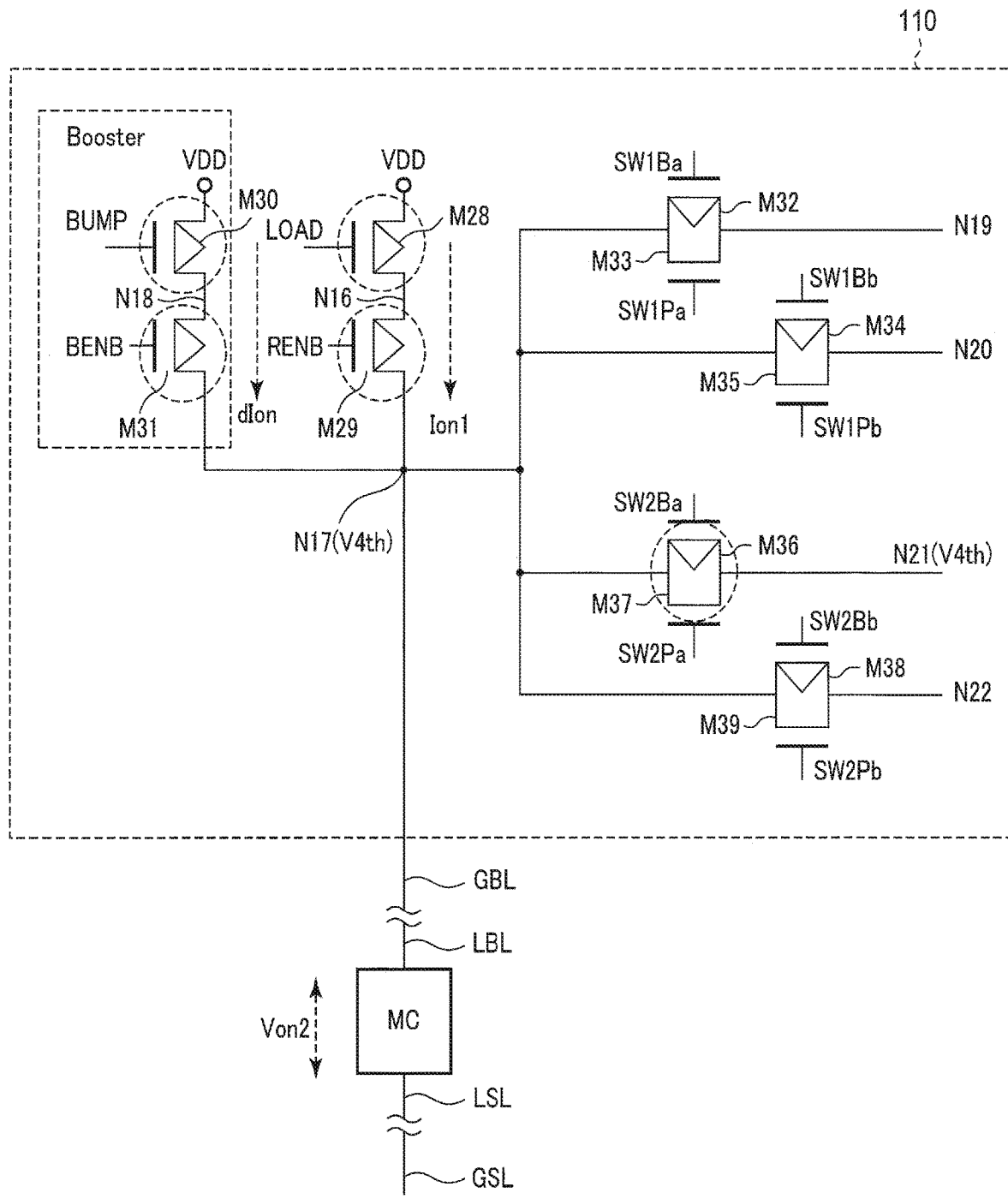
FIG. 33 is a circuit diagram illustrating the preamplifier in the readout operation of the semiconductor memory device according to the third embodiment.

With reference to FIG. 29 and FIG. 30, an outline of the readout operation of the semiconductor memory device according to the third embodiment is described.

[Step S3001]

When a memory controller 2 receives a readout order (host command) from a host 3, the memory controller 2 issues an active command and a readout command to a semiconductor memory device 1.

When the semiconductor memory device 1 receives the active command and the readout command from the memory controller 2, the semiconductor memory device 1 performs an operation (ON operation) for placing the selector (selected selector) of the selected memory cell MC to be read out into an ON state. Specifically, a controller 15 supplies a first current to the selected memory cell MC. The selected memory cell MC does not cause a large amount of current to flow in an OFF state, and hence can be regarded to be similar to a capacitor. Therefore, one end of the selected memory cell MC is charged when the first current flows into the one end of the selected memory cell MC.

[Step S3002]

The semiconductor memory device 1 performs a third readout operation in a state in which Step S3001 has been performed. By the third readout operation, the preamplifier 121 stores the voltage applied to the memory cell MC to be read out as voltage information (signal voltage) V3rd. Then, the change of a voltage signal V4th described below is determined with the voltage signal V3rd serving as a reference voltage.

[Step S3003]

In the operation of Step S3001, the selected memory cell MC is not placed in an ON state. Thus, the semiconductor memory device 1 supplies a second current to the selected memory cell MC as an operation (ON operation) for placing the selected memory cell MC into an ON state. In other words, the first current and the second current are supplied to the selected memory cell MC. One end of the selected memory cell MC is charged by the first current and the second current.

Note that the second current is supplied for an extremely short amount of time (an amount of time that is shorter than other steps). Therefore, in a short period of time in Step S3003, the one end of the selected memory cell MC is steeply charged.

[Step S3004]

The semiconductor memory device 1 performs a fourth readout operation on the memory cell MC on which the third readout operation is performed. The preamplifier 121 generates voltage information (signal voltage) V4th by the fourth readout operation.

The sense amplifier unit 120 determines the magnitudes of V3rd generated by Step S3002 and V4th generated by Step S3004. Specifically, the comparison unit 1222 compares the voltage V3rd and the voltage V4th with each other.

As shown in FIG. 30, when current is supplied to the memory cell MC, the voltage applied to the memory cell MC is stepped up until a voltage Vsel is reached. Then, when the voltage Vsel is exceeded, the voltage applied to the memory cell MC is stepped down.

In this embodiment, the semiconductor memory device 1 determine whether the selector is in an ON state from the change of the voltage by utilizing the characteristics.

The semiconductor memory device 1 sets a voltage Von1 generated by the initial current supply (Step S3001) as a reference voltage, and determines whether the voltage applied to the memory cell MC is stepped down from the second current supply and the current supply thereafter.

In other words, the semiconductor memory device 1 determines that "the memory cell MC is in an OFF state" when the results in Step S3003 and Step S3004 are within the range of SS1 shown in FIG. 30. The semiconductor memory device 1 determines that "the memory cell MC is in an ON state" when the results in Step S3003 and Step S3004 are within the range of SS2 shown in FIG. 30.

When the semiconductor memory device 1 determines that the memory cell is not in an ON state, the semiconductor memory device 1 repeats Step S3003 and Step S3004.

When the semiconductor memory device 1 determines that the memory cell is in an ON state, the semiconductor memory device 1 proceeds to Step S3006 while supplying a constant current that maintains the ON state of the selected memory cell MC.

[Step S3006] to [Step S3009]

Step S3006 to Step 83009 are the same as Step S1003 to Step S1006 in FIG. 14.

<3-2-1> Specific Example of Readout Operation

A specific example of the readout operation of the semiconductor memory device according to the third embodiment is described along a waveform diagram of FIG. 31. FIG. 31 illustrates a time relationship between the steps illustrated in FIG. 29, the state of the memory cell, and the voltages of the signal LOAD, the signal BUMP, the local bit line LBL, the local source line LSL, the signal RENB, the signal BENB, the signal SW1Ba, the signal SW1Pa, the signal SW1Bb, the signal SW1Pb, the signal SW2Ba, the signal SW2Pa, the signal SW2Bb, the signal SW2Pb, and the voltage V3rd and the voltage V4th applied to the selected memory cell.

[Time T30] to [Time T32]

At time T30, the controller 15 steps down the signal LOAD from the voltage Vss to a voltage VLOAD (Vss>VLOAD) in the ON operation (Step S3001). The controller 15 steps down the signal BUMP from the voltage Vss to a voltage VBUMP (VLOAD>VBUMP).

At time T30, the controller 15 sets the electric potentials of the signal SW1Ba, the signal SW1Bb, the signal SW2Ba, and the signal SW2Bb to an "L" level, and sets the electric potentials of the signal RENB, the signal BENB, the signal SW1Pa, the signal SW1Pb, the signal SW2Pa, and the signal SW2Pb to an "H" level. The electric potentials of the local bit line LBL and the local source line LSL become VUS.

At time T31, the controller 15 sets the signal SW1Ba to an "H" level and sets the signal SW1Pa and the signal RENB to an "L" level in the ON operation (Step S3001). The controller 15 maintains the non-selected local source line LSL at a voltage VUS, and steps down the selected local source line LSL to the voltage Vss.

As illustrated in FIG. 32, the transistors M28 and M29 are placed into an ON state, and a first current Ion1 is supplied to the selected memory cell MC. As a result, the voltage Von1 (V3rd) is applied to the selected memory cell MC. However, the voltage Vsel is not exceeded, and hence the selected memory cell MC is maintained in an OFF state. The electric potential of the node N17 at this time is the voltage V3rd.

The transistors M32 and M33 are placed into an ON state, and hence the voltage of the node N17 is transferred to the node N19.

[Time T32] to [Time T34]

At time T32, the controller 15 sets the signal SW1Pa to an "H" level, and sets the signal SW1Ba and the signal BENB to an "L" level in an ON operation (Step S3002).

As illustrated in FIG. 32, the transistors M30 and M31 are placed into an ON state, and a second current Ion2 is supplied to the selected memory cell MC.

As a result, a voltage Von2 that is higher than the voltage Von1 is applied to the selected memory cell MC. The electric potential of the node N17 at this time is the voltage V4th.

At time T33, the controller 15 sets the signal BENB and the signal SW2Ba to an "H" level, and sets the signal SW2Pa to an "L" level in the ON operation (Step S3002).

As a result, the transistors M36 and M37 are placed into an ON state, and hence the voltage of the node N17 is transferred to the node N21.

Note that, the amount of time from time T32 to time T33 is shorter than the amount of time defined by another time and another time.

The comparison unit 1222 compares the magnitudes of the voltage V3rd and the voltage V4th with each other from time T33 to time T34.

In this example, the voltage V4th is higher than the voltage V3rd, and hence the semiconductor memory device 1 determines that the selected memory cell MC is in an OFF state. Then, the semiconductor memory device 1 repeats Step S3003 to Step S3005 until the selected memory cell MC is placed into an ON state.

[Time T38] to [Time T39]

In an operation from time T35 to time T38, the semiconductor memory device 1 determines that the voltage V4th is lower than the voltage V3rd, that is, the selected memory cell MC is in an OFF state.

Therefore, at time T38, the controller 15 sets the signal SW1Bb and the signal SW2Pa to an "H" level, and sets the signal SW1Pb and the signal SW2Ba to an "L" level in the first readout operation (Step S3006).

Figure 34:
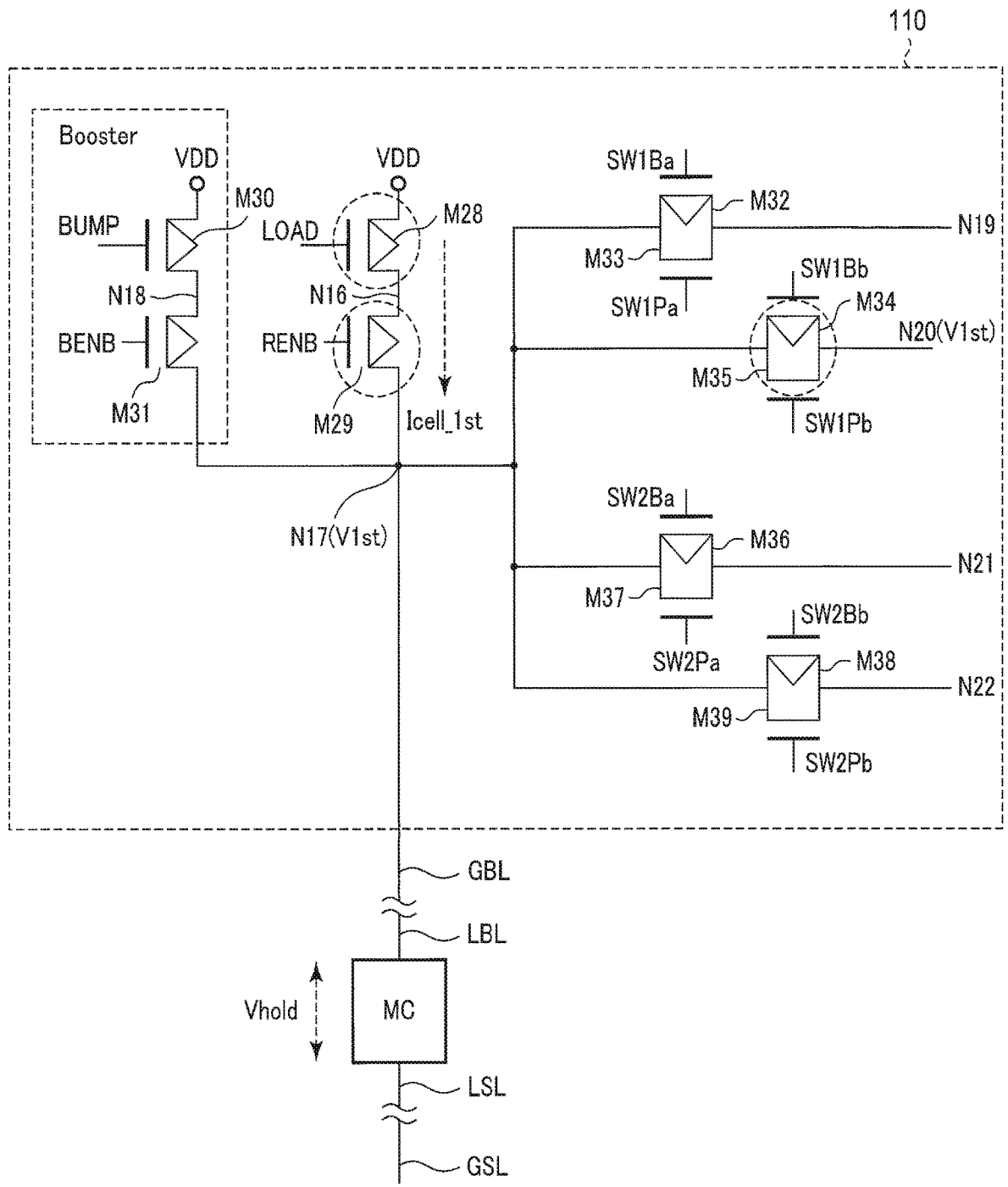
FIG. 34 is a circuit diagram illustrating the preamplifier in the readout operation of the semiconductor memory device according to the third embodiment.

As a result, as illustrated in FIG. 34, the transistors M34 and M35 are placed into an ON state, and the voltage V1st can be transferred to the node N20 from the node N17.

[Time T39] to [Time T40]

The controller 15 executes Step S3007.

[Time T40] to [Time T41]

At time T40, the controller 15 sets the signal SW2Bb to an "H" level, and sets the signal SW2Pb to an "L" level in the second readout operation (Step S3008).

As a result, as illustrated in FIG. 35, the transistors M38 and M39 are placed into an ON state, and the voltage V2nd can be transferred to the node N22 from the node N17.

[Time T41] Onward

Then, from time T41, the semiconductor memory device 1 performs an operation similar to that from time T4 described in FIG. 16.

<3-3> Effect

According to the embodiment described above, the comparison unit 1222 monitors the voltage applied to the selected memory cell MC. Then, when it is determined that the voltage (V4th) applied to the selected memory cell MC in the second application and the application thereafter falls below the reference voltage (V3rd) in the first application, it is determined that the selected memory cell MC is in an ON state.

As described above, according to the third embodiment, even when a constant-current-type preamplifier is employed as the preamplifier 121, an effect similar to that of the second embodiment can be obtained.

<3-4> Modified Example

Note that the type of preamplifier referred to as a "constant current type" may have a configuration that causes a write current to flow. With reference to FIG. 36 and FIG. 37, a modified example of the third embodiment is described below.

<3-4-2> Configuration of Preamplifier

With reference to FIG. 36, a configuration of a preamplifier 121 of a semiconductor memory device according to the modified example of the third embodiment is described. Note that the preamplifier 121 described in the modified example of the third embodiment is a type of preamplifier referred to as a "constant current type", and further includes a constant current circuit that supplies write current to the memory cell.

As illustrated in FIG. 36, the preamplifier 121 includes PMOS transistors M28, M29, M34, M38, M40, and M41, and NMOS transistors M5, M6, M35, and M39.

The transistor M28 has one end to which a power supply voltage VDDR (voltage for readout) is applied, the other end connected to a node N16, and a gate electrode to which a signal LOAD is supplied.

The transistor M29 has one end connected to the node N16, the other end connected to a node N17 (global bit line), and a gate electrode to which a signal RENB is supplied.

The transistor M5 has one end to which a power supply voltage VDD is applied, the other end connected to a node N4, and a gate electrode to which a signal BUMP is supplied.

The transistor M6 has one end connected to the node N4, the other end connected to the node N17 (global bit line), and a gate electrode to which a signal BEN is supplied.

The transistors M5 and M6 function as a booster for placing the selected memory cell MC into an ON state.

The transistor M34 has one end connected to the node N17, the other end connected to a node N20, and a gate electrode to which a signal SW1Bb is supplied.

The transistor M35 has one end connected to the node N17, the other end connected to the node N20, and a gate electrode to which a signal SW1Pb is supplied.

The transistor M34 and the transistor M35 function as a switch. As described below, the switch is a switch that is used only in a first readout operation after the selected memory cell MC is placed into an ON state. When the transistor M34 and the transistor M35 are placed into an ON state, a voltage V1st is supplied to the node N20. As described above, the electric potential of the node N17 is supplied to an amplifier 1221 as the voltage V1st. The transistors M34 and M35 and the node N17 can be conceived as a V1st generating unit.

The transistor M38 has one end connected to the node N17, the other end connected to a node N22, and a gate electrode to which a signal SW2Bb is supplied.

The transistor M39 has one end connected to the node N17, the other end connected to the node N22, and a gate electrode to which a signal SW2Pb is supplied.

The transistor M38 and the transistor M39 function as a switch. As described below, the switch is a switch that is used only in a second readout operation after the selected memory cell MC is placed into an ON state. When the transistor M38 and the transistor M39 are placed into an ON state, a voltage V2nd is supplied to the node N22. As described above, the electric potential of the node N17 is supplied to the amplifier 1221 as the voltage V2nd. The transistors M38 and M39 and the node N17 can be conceived as a V2nd generating unit.

The transistor M40 has one end to which a power supply voltage VDDW (voltage for the write) is applied, the other end connected to a node N23, and a gate electrode to which a signal LOADW is supplied.

The transistor M41 has one end connected to the node N23, the other end connected to the node N17 (global bit line), and a gate electrode to which a signal WENB is supplied.

The transistors M40 and M41 function as a writing constant-current circuit for supplying a write constant current to the selected memory cell MC.

<3-4-3> Specific Example of Readout Operation

In the modified example, an operation basically without Step S3003 to Step S3005 of FIG. 29 is performed.

A specific example of a readout operation of the semiconductor memory device according to the modified example of the third embodiment is described along a waveform diagram of FIG. 37. FIG. 37 illustrates a time relationship between the steps illustrated in FIG. 29, the state of the memory cell, the voltages of the signal LOAD, the signal LOADW, the signal BUMP, a local bit line LBL, a local source line LSL, the signal RENB, the signal BEN, the signal WENB, signals SEN and SEN2, the signal SW1Bb, the signal SW1Pb, the signal SW2Bb, the signal SW2Pb, and a signal Vshft1, and the current value of a current value ireadwrite.

[Time T0] to [Time T1]

At time T0, the controller 15 steps down the signal LOAD from a voltage Vss to a voltage VLOAD (Vss>VLOAD) in an ON operation (Step S3001). The controller 15 steps down the signal LOADW from the voltage Vss to a voltage VLOADW (VLOADW<VLOAD). The controller 15 steps up the signal BUMP from the voltage Vss to a voltage VBUMP.

At time T0, the controller 15 sets the electric potentials of the signal BEN, the signal SEN, the signal SEN2, the signal Vshft1, the signal SW1Bb, and the signal SW2Bb to an "L" level, and sets the electric potentials of the signal RENB, the signal WENB, the signal SW1Pb, and the signal SW2Pb to an "H" level. The electric potentials of the local bit line LBL and the local source line LSL become VUS.

At time T1, the controller 15 sets the signal RENB to an "L" level in an ON operation (Step S3001). The controller 15 maintains the non-selected local source line LSL at a voltage VUS, and steps down the selected local source line LSL to the voltage Vss.

The transistors M28 and M29 are placed into an ON state, and a first current Ion1 is supplied to the selected memory cell MC. As a result, a voltage Von1 is applied to the selected memory cell MC. However, a voltage Vsel is not exceeded, and hence the selected memory cell MC is maintained in an OFF state.

[Time T2] to [Time T4]

At time T2, the controller 15 sets the signal BEN to an "H" level in the ON operation (Step S3002).

The transistors M5 and M6 are placed into an ON state, and a second current Ion2 is supplied to the selected memory cell MC.

As a result, a voltage Von2 that is higher than the voltage Von1 is applied to the selected memory cell MC. At this time, the selected memory cell MC is turned ON in the middle of the operation by a voltage on which a constant voltage boosting has been performed, and the voltage of the selected memory cell MC becomes a voltage on which a constant current control is performed.

At time T3, the controller 15 sets the signal BEN to an "L" level in the ON operation (Step S3002). As a result, a current specified by a constant current flows through the selected memory cell MC.

Note that the amount of time from time T2 to time T3 is shorter than the amount of time defined by another time and another time.

[Time T4] to [Time T9]

At time T4, the controller 15 sets the signal SW1Bb to an "H" level, and sets the signal SW1Pb to an "L" level in the first readout operation (Step S3006).

As a result, the transistors M34 and M35 are placed into an ON state, and the voltage V1st can be transferred to the node N20 from the node N17.

At time T6, the controller 15 sets the signal WENB to an "L" level, to thereby supply a write current to the selected memory cell MC (performs Step S3007). At this time, a summed current based on the voltage Vload and the voltage Vloadw is supplied to the selected memory cell MC.

At time T7, the controller 15 sets the signal SW2Bb to an "H" level, and sets the signal SW2Pb to an "L" level in the second readout operation (Step S3008).

As a result, the transistors M38 and M39 are placed into an ON state, and the voltage V2nd can be transferred to the node N22 from the node N17.

[Time T41] Onward

Then, from time T41, the semiconductor memory device 1 performs an operation similar to that from time T4 described in FIG. 16.

<4> Other

Note that, in the above-mentioned embodiments, a case where the first example is applied as the configuration of the memory cell MC is described. However, in each of the above-mentioned embodiments, the second example may be applied as the configuration of the memory cell MC, and an effect similar to that when the first example is applied can be obtained.

In each of the above-mentioned embodiments, the memory system or the semiconductor memory device may be a package.

The term "connected" in each of the above-mentioned embodiments also includes a state in which objects are indirectly connected to each other with something else, such as a transistor or a resistance, for example, interposed therebetween.

As a resistance change element, an MRAM that stores data therein with use of a magnetoresistance effect element (Magnetic Tunnel junction (MTJ) element) is described as an example here, but the embodiments are not limited thereto.

For example, the embodiments can also be applied to a semiconductor memory device including a resistance change memory similar to the MRAM, for example, an element that stores data therein by utilizing the resistance change such as a ReRAM and a PCRAM.

The embodiments can be applied to a semiconductor memory device including an element capable of storing data therein in accordance with the resistance change associated with the application of current or voltage or performing the readout of the data that is stored by converting the resistance difference associated with the resistance change to a current difference or a voltage difference regardless of whether the element is a volatile memory or a non-volatility memory.

While certain embodiments have been described, these embodiments have been presented by way of example only, and are not intended to limit the scope of the inventions/present disclosures. Indeed, the novel methods and systems described herein may be embodied in a variety of other forms; furthermore, various omissions, substitutions and changes in the form of the methods and systems described herein may be made without departing from the spirit of the inventions present disclosures. The accompanying claims and their equivalents are intended to cover such forms or modifications as would fall within the scope and spirit of the inventions/present disclosures.

What is claimed is:

1. A semiconductor memory device, comprising:
a memory cell comprising a switching element and a resistance change element; and
a first circuit that applies a first voltage to the memory cell, places the memory cell into an ON state by applying a second voltage to the memory cell while applying the first voltage to the memory cell in parallel, generates a third voltage based on a resistance state of the resistance change element by performing a first voltage application to perform a first readout on the memory cell in the ON state, writes first data into the memory cell, generates a fourth voltage based on a first data resistance state of the resistance change element by performing the first voltage application to perform a second readout on the memory cell in which the first data is written, and determines data stored in the memory cell at a time of the first readout based on the third voltage and the fourth voltage.

2. The semiconductor memory device according to claim 1, wherein the first circuit generates a first current based on the third voltage, generates a second current based on the fourth voltage, and determines the data stored in the memory cell at the time of the first readout by adding a third current to the first current or the second current.

3. The semiconductor memory device according to claim 1, wherein the first circuit stops applying the second voltage before the first readout is performed.

4. The semiconductor memory device according to claim 3, wherein the first circuit generates a first current based on the third voltage, generates a second current based on the fourth voltage, and determines the data stored in the memory cell at the time of the first readout by adding a third current to the first current or the second current.

5. A semiconductor memory device, comprising:
a memory cell comprising a switching element and a resistance change element; and
a first circuit that generates a second voltage based on an ON/OFF state of the switching element by applying a first voltage to the memory cell to perform a first readout on the memory cell, generates a fourth voltage based on the ON/OFF state of the switching element by applying a third voltage to the memory cell while applying the first voltage to the memory cell in parallel and performing a first voltage application to perform a second readout on the memory cell, determines an ON state of the switching element based on the second voltage and the fourth voltage, generates a fifth voltage by performing the first voltage application to perform a third readout on the switching element in the ON state when the switching element is in the ON state, writes first data in the memory cell on which the third readout is performed, generates a sixth voltage based on a first data resistance state of the resistance change element by performing the first voltage application to perform a fourth readout on the memory cell in which the first data is written, and determines data stored in the memory cell at a time of the third readout based on the fifth voltage and the sixth voltage.

6. The semiconductor memory device according to claim 5, wherein the first circuit generates a first current based on the second voltage, generates a second current based on the fourth voltage, determines an ON state of the memory cell by adding a third current to the first current or the second current, generates a fourth current based on the fifth voltage, generates a fifth current based on the sixth voltage, and determines the data stored in the memory cell at the time of the third readout by adding a sixth current to the fourth current or the fifth current.

7. The semiconductor memory device according to claim 6, wherein the first circuit repeats the first readout when it is determined that the memory cell is not in the ON state.

8. The semiconductor memory device according to claim 5, wherein an application time of the third voltage is shorter than an application time of the first voltage.

9. The semiconductor memory device according to claim 8, wherein the first circuit generates a first current based on the second voltage, generates a second current based on the fourth voltage, determines an ON state of the memory cell by adding a third current to the first current or the second current, generates a fourth current based on the fifth voltage, generates a fifth current based on the sixth voltage, and determines the data stored in the memory cell at the time of the third readout by adding a sixth current to the fourth current or the fifth current.

10. The semiconductor memory device according to claim 8, wherein the first circuit repeats the first readout when it is determined that the memory cell is not in an ON state.

11. The semiconductor memory device according to claim 5, wherein the first circuit changes the third voltage and repeats the first readout when it is determined that the switching element is not in the ON state.

12. A semiconductor memory device, comprising:
a memory cell comprising a switching element and a resistance change element; and
a first circuit that generates a first voltage by supplying a first current to the memory cell, generates a second voltage by supplying a second current to the memory cell while supplying the first current to the memory cell, determines an ON state of the memory cell by comparing magnitudes of the first voltage and the second voltage, generates a third voltage by performing a first readout on the memory cell in the ON state when the memory cell is in the ON state, writes first data into the memory cell on which the first readout is performed, generates a fourth voltage by performing a second readout on the memory cell in which the first data is written, and determines data stored in the memory cell at a time of the first readout based on the third voltage and the fourth voltage.

13. The semiconductor memory device according to claim 12, wherein the first circuit generates a third current based on the third voltage, generates a fourth current based on the fourth voltage, and determines the data stored in the memory cell at the time of the first readout by adding a fifth current to the third current or the fourth current.

14. The semiconductor memory device according to claim 13, wherein the first circuit repeats generation of the second voltage when it is determined that the memory cell is not in the ON state.

15. The semiconductor memory device according to claim 12, wherein a supplying time of the second current is shorter than a supplying time of the first current.

16. The semiconductor memory device according to claim 15, wherein the first circuit generates a third current based on the third voltage, generates a fourth current based on the fourth voltage, and determines the data stored in the memory cell at the time of the first readout by adding a fifth current to the third current or the fourth current.

17. The semiconductor memory device according to claim 16, wherein the first circuit repeats generation of the second voltage when it is determined that the memory cell is not in the ON state.

18. The semiconductor memory device according to claim 15, wherein the first circuit repeats generation of the second voltage when it is determined that the memory cell is not in the ON state.

19. The semiconductor memory device according to claim 12, wherein the first circuit repeats generation of the second voltage when it is determined that the memory cell is not in the ON state.

20. A semiconductor memory device, comprising:
a memory cell comprising a switching element and a resistance change element;
a first circuit that applies a constant voltage to the memory cell for an amount of time; and
a second circuit that applies a constant current to the memory cell for an amount of time, wherein
the semiconductor memory device places the memory cell into an ON state by applying, while applying a first current to the memory cell by the first circuit, a second voltage to the memory cell by the second circuit, and performs readout on the memory cell in the ON state by the first current.

* * * * *